US010832970B2

(12) United States Patent
Lee et al.

(10) Patent No.: US 10,832,970 B2
(45) Date of Patent: Nov. 10, 2020

(54) SELF-ALIGNED SILICIDE/GERMANIDE FORMATION TO REDUCE EXTERNAL RESISTANCE IN A VERTICAL FIELD-EFFECT TRANSISTOR

(71) Applicant: International Business Machines Corporation, Armonk, NY (US)

(72) Inventors: ChoongHyun Lee, Rensselaer, NY (US); Kangguo Cheng, Schenectady, NY (US); Juntao Li, Cohoes, NY (US); Peng Xu, Santa Clara, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/575,796

(22) Filed: Sep. 19, 2019

(65) Prior Publication Data

US 2020/0013681 A1 Jan. 9, 2020

Related U.S. Application Data

(62) Division of application No. 16/017,352, filed on Jun. 25, 2018, now Pat. No. 10,504,794.

(51) Int. Cl.
*H01L 23/482* (2006.01)
*H01L 21/8238* (2006.01)
(Continued)

(52) U.S. Cl.
CPC .......... *H01L 21/823814* (2013.01); *H01L 21/28518* (2013.01); *H01L 21/823871* (2013.01);
(Continued)

(58) Field of Classification Search
CPC ..... H01L 21/823487; H01L 21/823885; H01L 29/7788
See application file for complete search history.

(56) References Cited

U.S. PATENT DOCUMENTS 7,230,286 B2 6/2007 Cohen et al.
7,446,025 B2 11/2008 Cohen et al.
(Continued)

OTHER PUBLICATIONS

C.H. Lee et al., "Oxygen Potential Engineering of Interfacial Layer for Deep Sub-nm EOT High-k Gate Stacks on Ge", IEEE International Electron Devices Meeting (IEDM), Dec. 9-11, 2013, 4 pages.
(Continued)

*Primary Examiner* — George R Fourson, III
(74) *Attorney, Agent, or Firm* — Douglas Pearson; Ryan, Mason & Lewis, LLP

(57) ABSTRACT

A method for manufacturing a vertical transistor device includes respectively forming a first and second plurality of fins in first and second device regions on a substrate. A plurality of bottom source/drain regions are formed adjacent lower portions of each of the fins, and a sacrificial layer is formed in the first device region on a first bottom source/drain region of the plurality of bottom source/drain regions. In the method, gate structures are formed on the bottom source/drain regions and sacrificial layer, and portions of the gate structures are removed to expose the sacrificial layer in the first device region and a second bottom source/drain region of the plurality of bottom source/drain regions in the second device region. The method further includes depositing a germanium oxide layer on the exposed sacrificial layer and second bottom source/drain region, and converting the germanium oxide layer to a plurality of silicide/germanide layers.

19 Claims, 20 Drawing Sheets

(51) Int. Cl.
*H01L 21/285* (2006.01)
*H01L 29/66* (2006.01)
*H01L 29/08* (2006.01)
*H01L 23/535* (2006.01)
*H01L 27/092* (2006.01)
*H01L 29/45* (2006.01)
*H01L 29/78* (2006.01)
*H01L 21/8234* (2006.01)

(52) U.S. Cl.
CPC .... *H01L 21/823885* (2013.01); *H01L 23/535* (2013.01); *H01L 27/092* (2013.01); *H01L 29/0847* (2013.01); *H01L 29/45* (2013.01); *H01L 29/665* (2013.01); *H01L 29/66553* (2013.01); *H01L 29/66666* (2013.01); *H01L 29/7827* (2013.01); *H01L 21/823418* (2013.01); *H01L 29/6653* (2013.01)

(56) References Cited

U.S. PATENT DOCUMENTS

| | | | |
|---|---|---|---|
| 7,795,689 B2 | 9/2010 | Kawakita | |
| 9,123,569 B1 | 9/2015 | Cheng et al. | |
| 9,171,715 B2 | 10/2015 | Matero | |
| 9,299,835 B1 | 3/2016 | Anderson et al. | |
| 9,318,581 B1 | 4/2016 | Guo et al. | |
| 9,368,572 B1* | 6/2016 | Cheng | H01L 29/7827 |
| 9,391,173 B2 | 7/2016 | Fogel et al. | |
| 9,412,817 B2 | 8/2016 | Yang et al. | |
| 9,680,473 B1* | 6/2017 | Anderson | H01L 27/0207 |
| 9,768,077 B1 | 9/2017 | Adusumilli et al. | |
| 9,773,913 B1 | 9/2017 | Balakrishnan et al. | |
| 9,934,977 B1* | 4/2018 | Adusumilli | H01L 21/28518 |
| 10,069,008 B1* | 9/2018 | Balakrishnan | H01L 29/66666 |
| 10,103,247 B1* | 10/2018 | Xie | H01L 21/823437 |
| 10,157,794 B1* | 12/2018 | Suvarna | H01L 29/7827 |
| 10,211,288 B1* | 2/2019 | Bi | H01L 21/823412 |
| 2009/0087985 A1 | 4/2009 | Nemouchi | |
| 2009/0200604 A1* | 8/2009 | Chidambarrao | H01L 29/78642 257/329 |
| 2010/0052029 A1* | 3/2010 | Huang | H01L 29/7827 257/309 |
| 2010/0295120 A1* | 11/2010 | Sandhu | H01L 27/2454 257/329 |
| 2011/0210375 A1 | 9/2011 | Ikeda et al. | |
| 2012/0052640 A1* | 3/2012 | Fischer | H01L 21/823487 438/268 |
| 2012/0319201 A1* | 12/2012 | Sun | H01L 29/7827 257/338 |
| 2013/0115768 A1 | 5/2013 | Pore et al. | |
| 2016/0155840 A1* | 6/2016 | Lemke | H01L 27/0883 257/334 |
| 2016/0190233 A1 | 6/2016 | Chang et al. | |
| 2017/0338334 A1* | 11/2017 | Cheng | H01L 21/26506 |
| 2018/0006118 A1* | 1/2018 | Mallela | H01L 29/7827 |
| 2018/0068857 A1 | 3/2018 | Adusumilli et al. | |
| 2019/0027586 A1* | 1/2019 | Zang | H01L 29/66787 |
| 2019/0081180 A1* | 3/2019 | Park | H01L 29/78642 |
| 2019/0172927 A1* | 6/2019 | Jagannathan | H01L 29/0653 |
| 2019/0181236 A1 | 6/2019 | Lee et al. | |
| 2019/0378765 A1* | 12/2019 | Xie | H01L 29/66666 |
| 2019/0385917 A1* | 12/2019 | Lee | H01L 21/823878 |
| 2019/0386145 A1* | 12/2019 | Ok | H01L 29/775 |
| 2019/0393104 A1* | 12/2019 | Ando | H01L 21/02532 |

OTHER PUBLICATIONS

List of IBM Patents or Patent Applications Treated as Related.

* cited by examiner

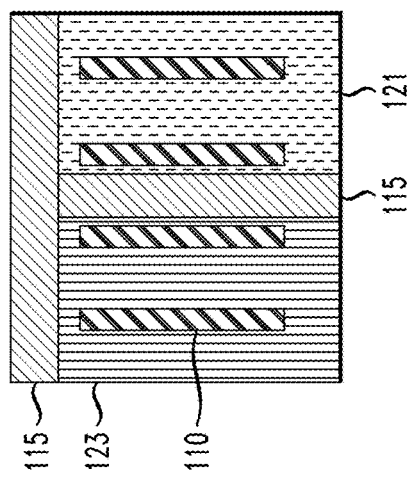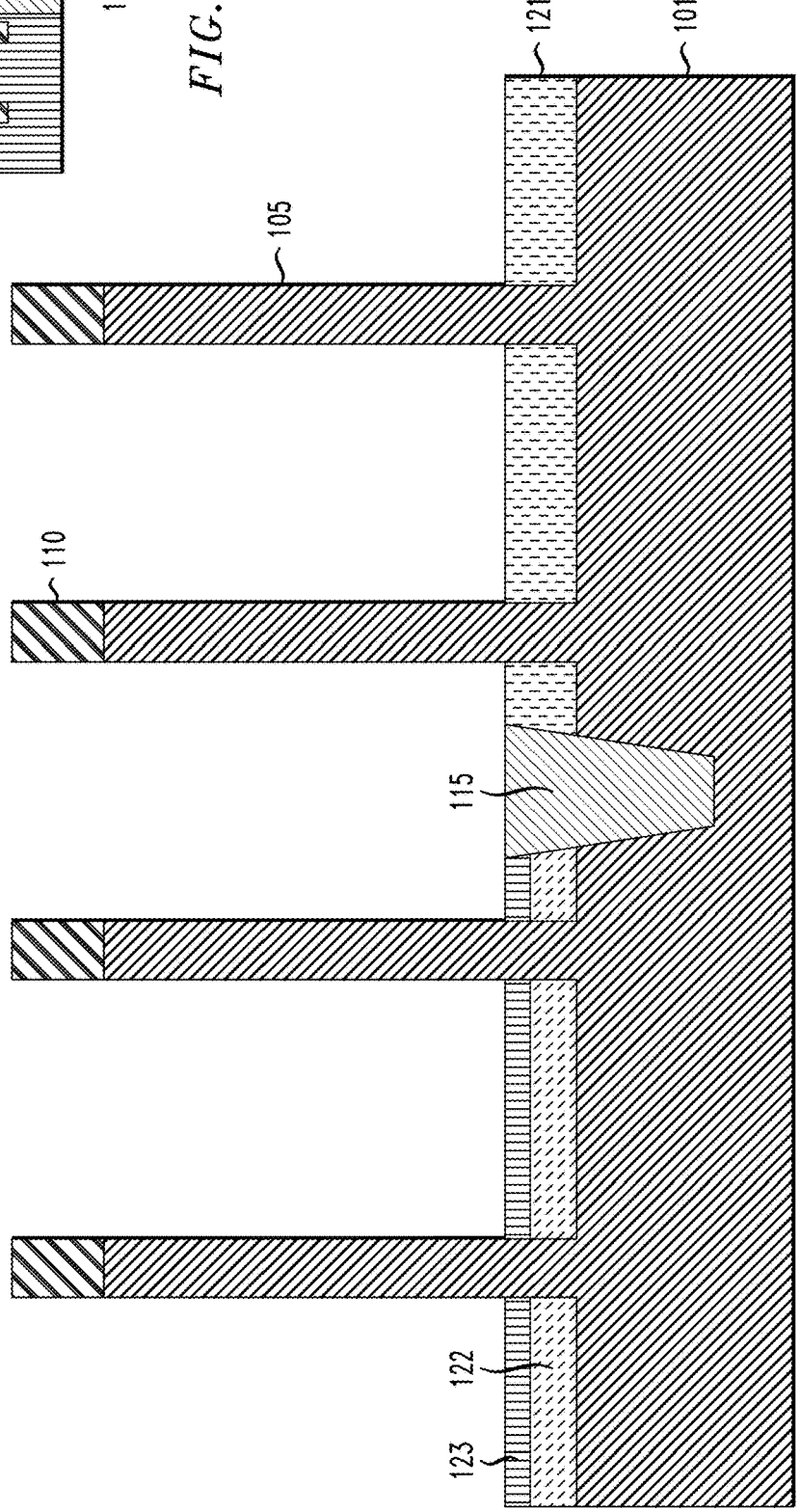

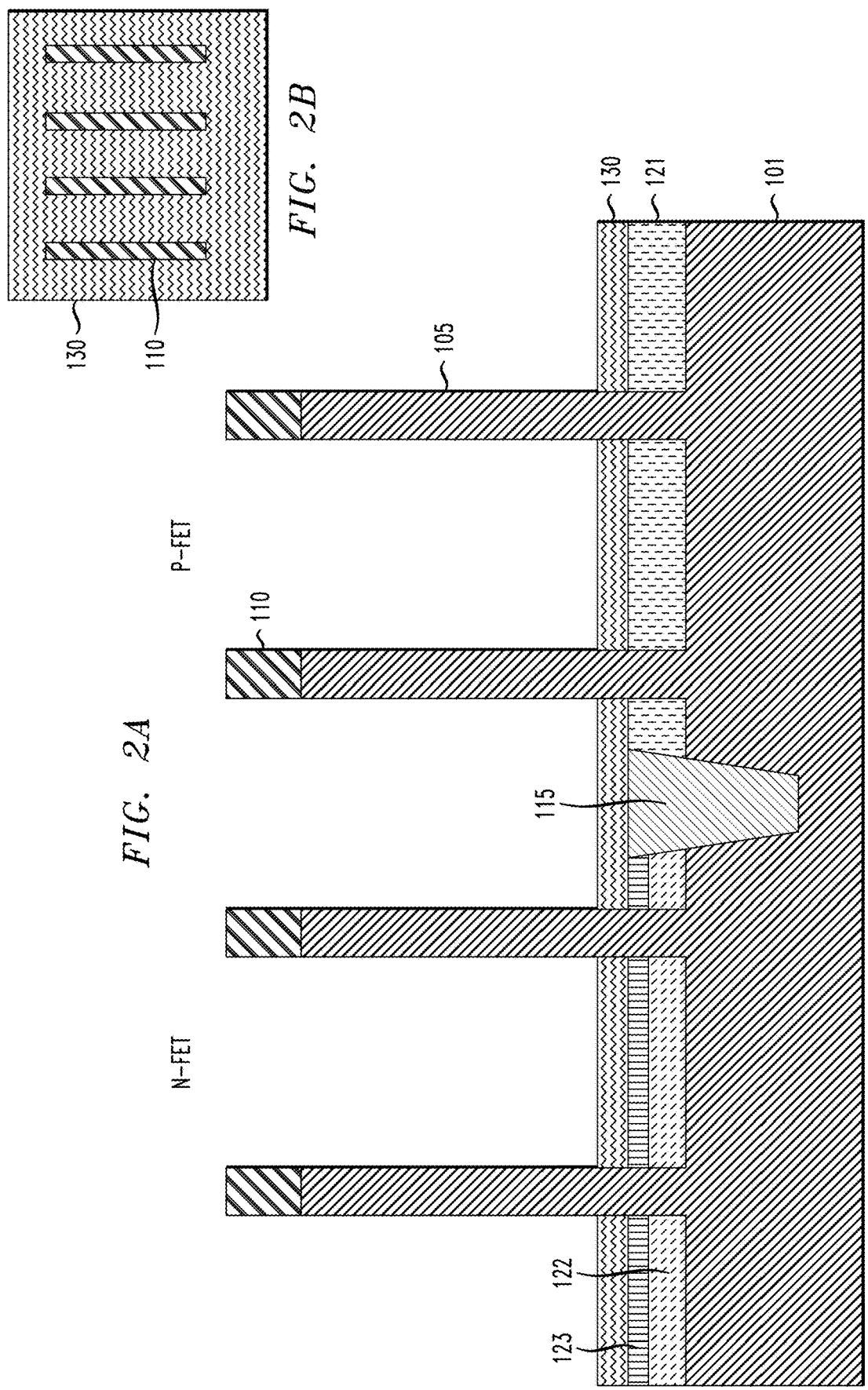

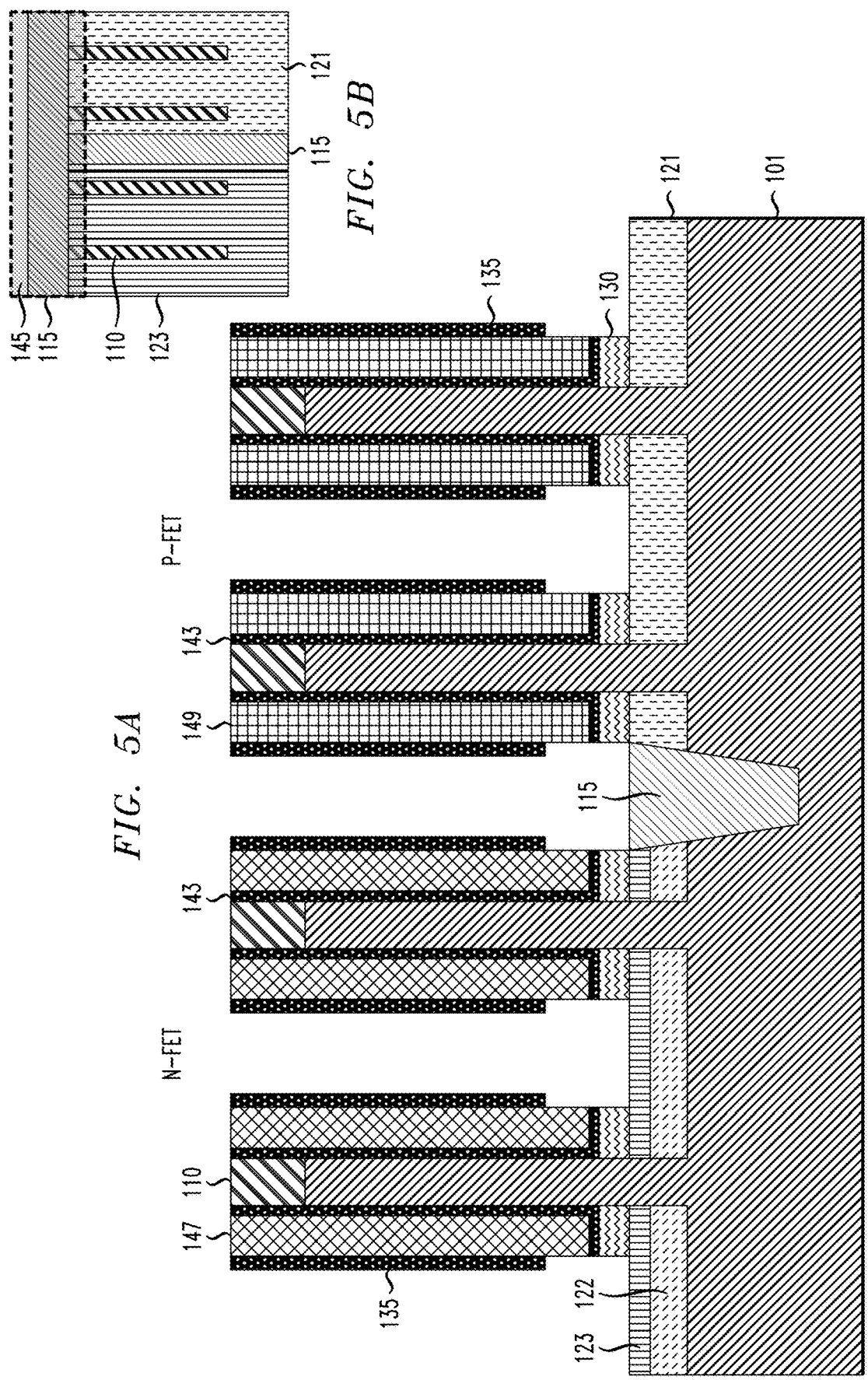

SELF-ALIGNED SILICIDE/GERMANIDE FORMATION TO REDUCE EXTERNAL RESISTANCE IN A VERTICAL FIELD-EFFECT TRANSISTOR

TECHNICAL FIELD

The field generally relates to semiconductor devices and methods of manufacturing same and, in particular, to forming a vertical field effect transistor (VFET) with silicide and/or germanide layers on bottom source/drain regions to reduce external resistance.

BACKGROUND

Fin field-effect transistor (FinFET) devices include a transistor architecture that uses raised source-to-drain channel regions, referred to as fins. Known FinFET devices include fins with source/drain regions on lateral sides of the fins, so that current flows in a horizontal direction (e.g., parallel to a substrate) between source/drain regions at opposite ends of the fins in the horizontal direction. As horizontal devices are scaled down, there is reduced space for metal gate and source/drain contacts, which leads to degraded short-channel control and increased middle of the line (MOL) resistance.

Vertical field effect transistors (VFETs) (also referred to as vertical transport field effect transistors (VTFETs)) are becoming viable device options for semiconductor devices beyond 7 nanometer (nm) node. VFET devices include fin channels with source/drain regions at ends of the fin channels on top and bottom sides of the fins. Current runs through the fin channels in a vertical direction (e.g., perpendicular to a substrate), for example, from a bottom source/drain region to a top source/drain region. Vertical transport architecture devices are designed to address the limitations of horizontal device architectures in terms of, for example, density, performance, power consumption, and integration by, for example, decoupling gate length from the contact gate pitch, providing a FinFET-equivalent density at a larger contacted poly pitch (CPP), and providing lower MOL resistance.

However, device performance of VFETs is limited by external resistance at the bottom source/drain region. Accordingly, there is a need for a VFET structure and method of forming same that results in reduced external resistance at bottom source/drain regions.

SUMMARY

According to an exemplary embodiment of the present invention, a method for manufacturing a vertical transistor device includes forming a first plurality of fins in a first device region on a substrate, and forming a second plurality of fins in a second device region on the substrate. A plurality of bottom source/drain regions are formed on the substrate adjacent lower portions of each of the first and second plurality of fins in the first and second device regions, and a sacrificial layer is formed in the first device region on a first bottom source/drain region of the plurality of bottom source/drain regions. In the method, a bottom spacer layer is formed on the plurality of bottom source/drain regions and the sacrificial layer, and a plurality of gate structures are formed on the bottom spacer layer. The method further includes removing portions of the plurality of gate structures and of the bottom spacer layer to expose the sacrificial layer in the first device region and a second bottom source/drain region of the plurality of bottom source/drain regions in the second device region. A metal-doped germanium oxide layer is deposited on the plurality of gate structures and on the exposed sacrificial layer and second bottom source/drain region, and an annealing process is performed to convert portions of the germanium oxide layer on the exposed sacrificial layer and second bottom source/drain region to a plurality of silicide and/or germanide layers.

According to an exemplary embodiment of the present invention, a vertical transistor device includes a first plurality of fins in a first device region on a substrate, and a second plurality of fins in a second device region on the substrate. A plurality of bottom source/drain regions are disposed on the substrate adjacent lower portions of each of the first and second plurality of fins in the first and second device regions, and a plurality of gate structures are disposed on the plurality of bottom source/drain regions. The vertical transistor device further includes a plurality of silicide and/or germanide layers on the plurality of bottom source/drain regions adjacent the plurality of gate structures.

According to an exemplary embodiment of the present invention, a method for manufacturing a vertical transistor device includes forming a first plurality of fins in a first device region on a substrate, and forming a second plurality of fins in a second device region on the substrate. A plurality of bottom source/drain regions are epitaxially grown on the substrate adjacent lower portions of each of the first and second plurality of fins in the first and second device regions, and a sacrificial layer is epitaxially grown in the first device region on a first bottom source/drain region of the plurality of bottom source/drain regions. The method further includes forming a plurality of gate structures on the plurality of bottom source/drain regions and the sacrificial layer, and removing portions of the plurality of gate structures to expose the sacrificial layer in the first device region and a second bottom source/drain region of the plurality of bottom source/drain regions in the second device region. In the method, a metal-doped germanium oxide layer is deposited on the plurality of gate structures, and on the exposed sacrificial layer and second bottom source/drain region. An annealing process is performed to convert portions of the metal-doped germanium oxide layer on the exposed sacrificial layer and second bottom source/drain region to a plurality of silicide and/or germanide layers.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which:

FIG. 1A is a cross-sectional view illustrating fin, bottom source/drain and sacrificial layer formation in a method of manufacturing a semiconductor device, according to an exemplary embodiment of the present invention.

FIG. 1B is a top down view illustrating fin, bottom source/drain and sacrificial layer formation in a method of manufacturing a semiconductor device, according to an exemplary embodiment of the present invention.

FIG. 2A is a cross-sectional view illustrating bottom spacer formation in a method of manufacturing a semiconductor device, according to an exemplary embodiment of the present invention.

FIG. 2B is a top down view illustrating bottom spacer formation in a method of manufacturing a semiconductor device, according to an exemplary embodiment of the present invention.

FIG. 5A is a cross-sectional view illustrating removal of exposed portions of a bottom spacer in a method of manufacturing a semiconductor device, according to an exemplary embodiment of the present invention.

FIG. 5B is a top down view illustrating removal of exposed portions of a bottom spacer in a method of manufacturing a semiconductor device, according to an exemplary embodiment of the present invention.

DETAILED DESCRIPTION

Figures 3A, 3B:
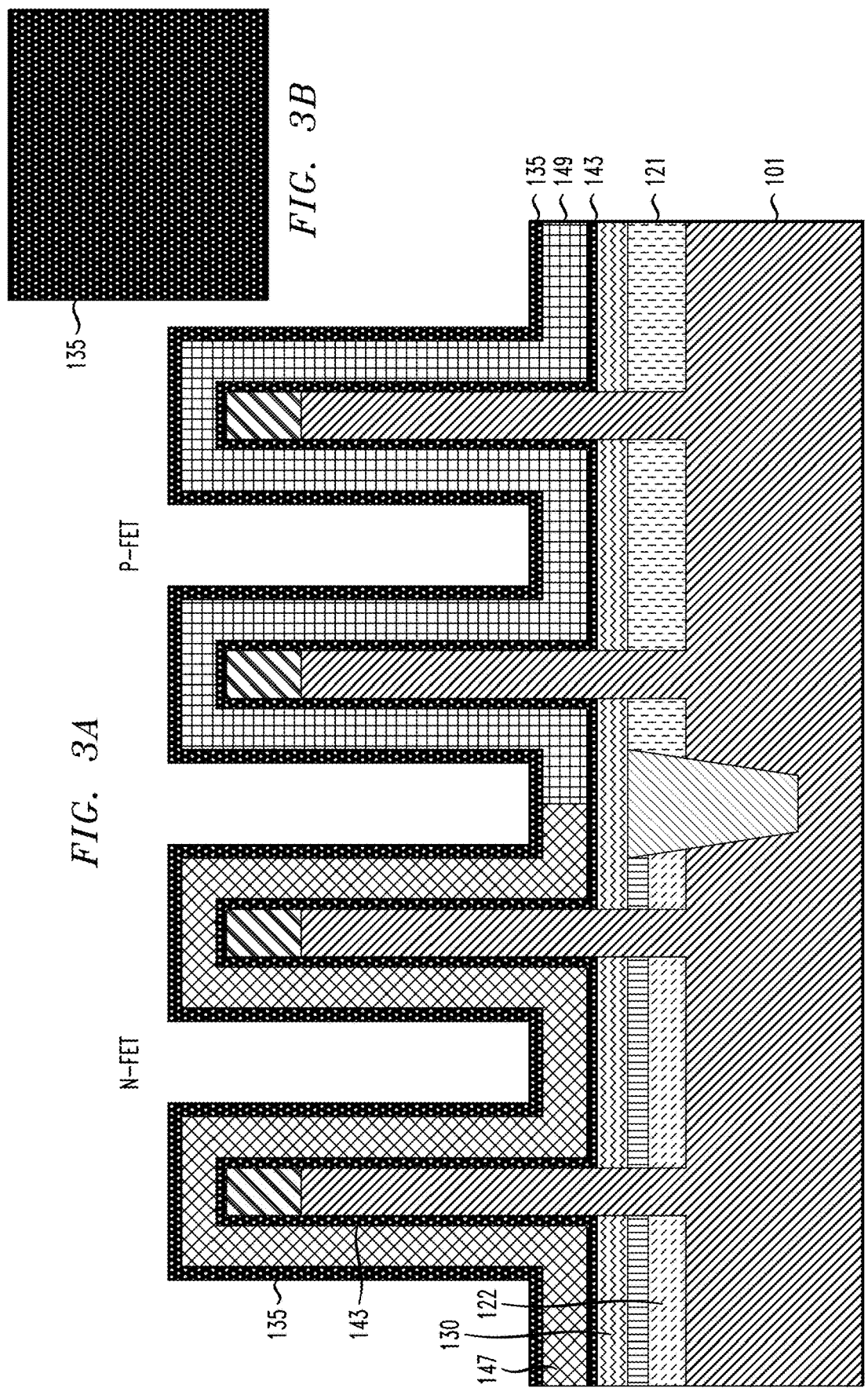
FIG. 3A is a cross-sectional view illustrating gate structure and top spacer formation in a method of manufacturing a semiconductor device, according to an exemplary embodiment of the present invention.
FIG. 3B is a top down view illustrating gate structure and top spacer formation in a method of manufacturing a semiconductor device, according to an exemplary embodiment of the present invention.

Exemplary embodiments of the invention will now be discussed in further detail with regard to semiconductor devices and methods of manufacturing same and, in particular, to VFET devices including a silicide and/or germanide structure covering a large area to reduce external resistance, and a gate encapsulation structure including layers of silicon nitride (SiN) and metal-doped germanium oxide ($GeO_x$).

It is to be understood that the various layers and/or regions shown in the accompanying drawings are not drawn to scale, and that one or more layers and/or regions of a type commonly used in, for example, FinFET, VFET, CMOS, field-effect transistor (FET), nanowire FET, nanosheet FETs, metal-oxide-semiconductor field-effect transistor (MOSFET), single electron transistor (SET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not necessarily be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require, for example, FinFETs, VFETs, CMOSs, FETs, nanowire FETs, nanosheet FETs, SETs, and/or MOSFETs. By way of non-limiting example, the semiconductor devices can include, but are not necessarily limited to FinFET, VFET, CMOS, FET, nanowire FET, nanosheet FET, SET, CMOS and MOSFET devices, and/or semiconductor devices that use FinFET, VFET, CMOS, FET, nanowire FET, nanosheet FET, SET, CMOS and/or MOSFET technology.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the cross-sectional views, and "horizontal" refers to a direction parallel to the top surface of the substrate in the cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

High external resistance at bottom source/drain regions can be due to a lack of silicide/germanide formation on these regions. However, processing schemes in which silicide/germanide layers are formed before gate stack formation might not be sustainable because of high thermal budget. Accordingly, embodiments of the present invention correspond to methods of fabricating and structures for VFETs where self-aligned silicide and/or germanide is formed in an all-around scheme to reduce the external resistance at bottom source/drain regions. In accordance with an embodiment of the present invention, a VFET device and method of manufacturing same includes silicide and/or germanide layers formed around fins for both n-type and p-type vertical transistors (e.g. an n-type FET (N-FET) and a p-type FET (P-FET)) without any thermal budget limitations.

Embodiments of the present invention provide an integration scheme for a self-aligned silicide/germanide-all-around structure in a VFET, which utilizes a sacrificial layer formed on a bottom source/drain region in an n-type transistor (e.g., N-FET) region. The sacrificial layer reacts with metal-doped germanium oxide ($GeO_x$) to form a silicide and/or germanide in the n-type transistor region. In accordance with an embodiment of the present invention, the sacrificial layer includes, for example, a phosphorous doped silicon germanium layer (SiGe:P) layer, which is formed on a bottom source/drain layer including, for example, phosphorous doped silicon (Si:P). Embodiments of the present invention further provide a gate encapsulation structure including silicon nitride (SiN)/metal-doped $GeO_x$/SiN. The embodiments of the present invention are applicable to both N-FET and P-FET devices and/or devices having both N-FET and P-FET regions.

Figure 13:
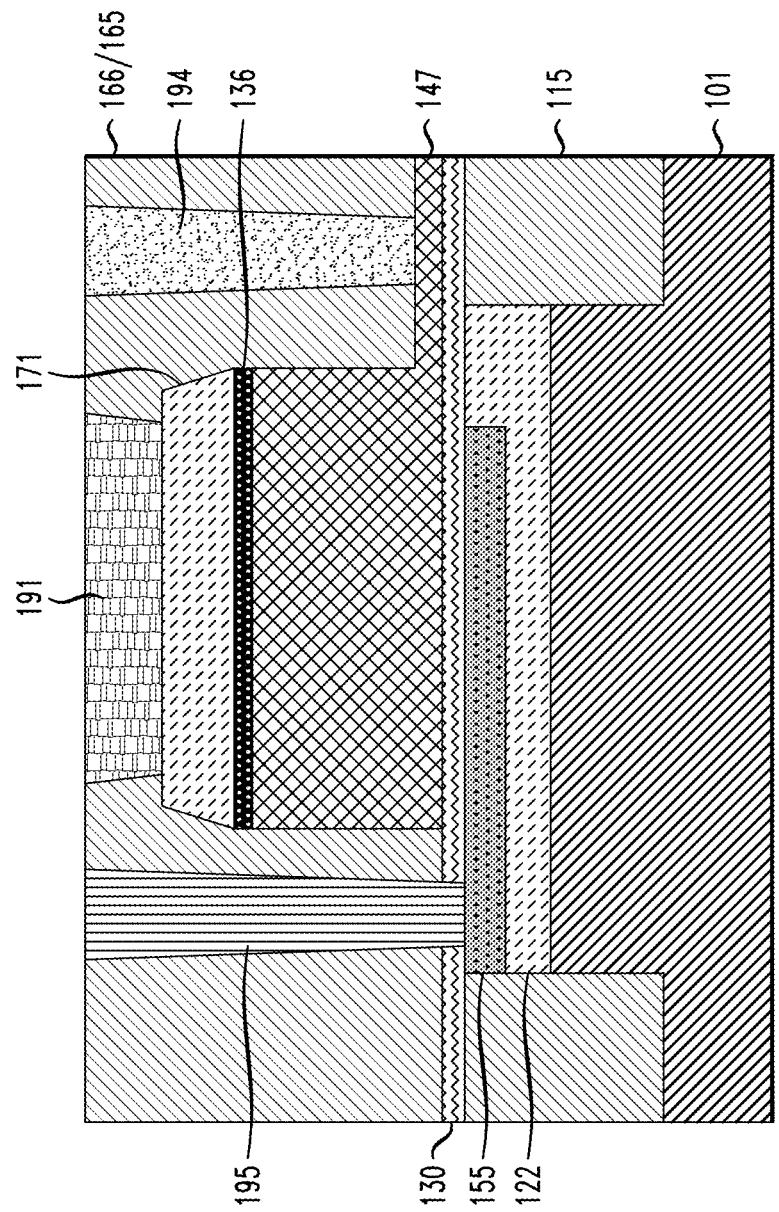
FIG. 13 is a cross-sectional view of the semiconductor device in FIG. 11 taken parallel to a length of the fins along the substrate, according to an exemplary embodiment of the present invention.

The cross-sections in FIGS. 1A, 2A, 3A, 4A, 5A, 6-11 and 14-20 are taken perpendicular to the length of the fins along the substrate. The cross-section in FIG. 13 is taken parallel to the length of the fins along the substrate.

FIG. 1A is a cross-sectional view and FIG. 1B is a top down view illustrating fin, bottom source/drain and sacrificial layer formation in a method of manufacturing a semiconductor device, according to an exemplary embodiment of the present invention. Referring to FIGS. 1A and 1B, a semiconductor substrate 101 includes semiconductor material including, but not limited to, silicon (Si), silicon germanium (SiGe), silicon carbide (SiC), Si:C (carbon doped silicon), silicon germanium carbide (SiGeC), carbon doped silicon germanium (SiGe:C), III-V, II-V compound semiconductor or other like semiconductor. In addition, multiple layers of the semiconductor materials can be used as the semiconductor material of the substrate. The semiconductor substrate 101 can be a bulk substrate or a semiconductor-on-insulator substrate such as, but not limited to, a silicon-on-insulator (SOI), silicon-germanium-on-insulator (SGOI) or III-V-on-insulator substrate including a buried insulating layer, such as, for example, a buried oxide, nitride layer or aluminum oxide.

Fins, such as fins 105, can be formed by patterning a semiconductor layer into the fins 105. The semiconductor layer can include, but is not necessarily limited to, Si, SiGe or III-V materials, and may be epitaxially grown. According to an embodiment, a hardmask 110 including, for example, a dielectric material, such as silicon nitride (SiN) is formed on portions of the semiconductor layer that are to be formed into the fins 105. The fin patterning can be done by various patterning techniques, including, but not necessarily limited to, directional etching and/or a sidewall image transfer (SIT) process, for example. The SIT process includes using lithography to form a pattern referred to as a mandrel. The mandrel material can include, but is not limited to, amorphous silicon or amorphous carbon. After the mandrel formation, a conformal film can be deposited and then followed by an etchback. The conformal film will form spacers at both sides of the mandrel. The spacer material can include, but is not limited, oxide or SiN. After that, the mandrel can be removed by reactive ion etching (ME) processes. As a result, the spacers will have half the pitch of the mandrel. In other words, the pattern is transferred from a lithography-defined mandrel to spacers, where the pattern density is doubled. The spacer pattern can be used as the hard mask to form the fins by ME processes. Alternatively, fin patterning can be done by any other suitable patterning technique, including but not limited to, lithography (e.g., extreme ultraviolet (EUV)) in conjunction with ME, self-aligned double patterning (SADP), self-aligned multiple patterning (SAMP), and/or self-aligned quadruple patterning (SAQP)). While embodiments of the present invention describe channel regions as fins, the embodiments are not necessarily limited to fin channel regions, and may include nanowire channel regions. In addition, although four fins 105 are shown in the figures for ease of explanation, more or less than four fins can be formed.

In order to form one or more isolation regions 115, one or more trenches are formed in the substrate 101, by for example, a wet or dry etch process. A dielectric material layer including, but not necessarily limited to silicon oxide ($SiO_x$), where x is, for example, 2 in the case of silicon dioxide ($SiO_2$), or 1.99 or 2.01, low-temperature oxide (LTO), high-temperature oxide (HTO), flowable oxide (FOX), silicon oxycarbide (SiOC), silicon oxycarbonitride (SiOCN) or some other dielectric, is formed on the substrate 101 and in the trenches, and around the fins 105. The dielectric material can be deposited using deposition techniques including, but not limited to, chemical vapor deposition (CVD), plasma enhanced CVD (PECVD), radio-frequency CVD (RFCVD), physical vapor deposition (PVD), atomic layer deposition (ALD), molecular layer deposition (MLD), molecular beam deposition (MBD), pulsed laser deposition (PLD), liquid source misted chemical deposition (LSMCD), and/or sputtering, followed by a planarization process, such as, chemical mechanical planarization (CMP) to remove excess dielectric material. Portions of the dielectric layer are removed from around the fins 110 in what are the n-type and p-type transistor regions (N-FET and P-FET) regions to define the one or more isolation regions 115, such as, for example, shallow trench isolation (STI) regions. The patterning of the dielectric layer can be performed using appropriate masking and removal techniques, including, but not necessarily limited to, RIE and optical lithography.

Bottom source/drain regions 121 and 122 are formed in the P-FET and N-FET regions, respectively, around the fins 110. After recessing portions of the substrate 101 where the bottom source/drain regions 121 and 122 are to be formed, the bottom source/drain regions 121 and 122 can be formed by bottom-up epitaxial growth processes (with optional dummy vertical dielectric liners covering fin sidewalls during epitaxial growth), wherein the bottom source/drain regions 121 and 122 are grown in separate epitaxial processes from each other to certain heights (thicknesses). As can be seen, the bottom source/drain region 122 is grown to a lesser height (thickness) than the bottom source/drain region 121 to allow for the sacrificial layer, which is formed on the bottom source/drain region 122. The epitaxially grown bottom source/drain regions 121 and 122 can be in-situ doped, meaning dopants are incorporated into the epitaxy film during the epitaxy process. Other alternative doping techniques can be used, including but not limited to, for example, ion implantation, gas phase doping, plasma doping, plasma immersion ion implantation, cluster doping, infusion doping, liquid phase doping, solid phase doping, etc., and dopants may include, for example, an n-type dopant selected from a group of phosphorus (P), arsenic (As) and antimony (Sb), and a p-type dopant selected from a group of boron (B), gallium (Ga), indium (In), and thallium (Tl) at various concentrations. For example, in a non-limiting example, a dopant concentration range may be $1\times10^{18}/cm^3$ to $1\times10^{21}/cm^3$. According to an embodiment, the bottom source/drain region 121 includes boron doped SiGe, and the bottom source/drain region 122 includes phosphorous doped silicon.

Terms such as "epitaxial growth and/or deposition" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Examples of various epitaxial growth processes include, for example, rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for an epitaxial deposition process can range from 500° C. to 900° C. Although higher temperature typically results in faster deposition, the faster deposition may result in crystal defects and film cracking.

A number of different sources may be used for the epitaxial growth of the compressively strained layer. In some embodiments, a gas source for the deposition of epitaxial semiconductor material includes a silicon containing gas source, a germanium containing gas source, or a combination thereof. For example, an epitaxial silicon layer may be deposited from a silicon gas source including, but not necessarily limited to, silane, disilane, ldisilane, trisilane, tetrasilane, hexachlorodisilane, tetrachlorosilane, dichlorosilane, trichlorosilane, and combinations thereof. An epitaxial germanium layer can be deposited from a germanium gas source including, but not necessarily limited to, germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

Referring further to FIGS. 1A and 1B, a sacrificial layer 123 is epitaxially grown on the bottom source/drain region 122 in the N-FET region. In accordance with an embodiment of the present invention, the sacrificial layer is used to form a silicide and/or germanide layer on the N-FET region during subsequent processing, and includes germanium. For example, the sacrificial layer 123 is SiGe:P, and is epitaxially grown on the bottom source/drain region 122 comprising Si:P. The sacrificial layer may also be SiGe, without phosphorous. Atomic percentage of Ge in the sacrificial layer can vary, for example, in the range of about 10% to about 50%.

As can be seen in FIG. 1A, the combined height (thickness) of layers 122 and 123 is the same or substantially the same as the height (thickness) of bottom source/drain region 121 so that an upper surface of the sacrificial layer 123 is planar or substantially planar with the upper surface of the bottom source/drain region 121. According to an embodiment, the N-FET or the P-FET region is covered with a mask while epitaxial growth is performed on the uncovered side. Then, the mask is removed and a mask applied to the previously uncovered region so that epitaxial growth can be performed on the previously covered region.

FIG. 2A is a cross-sectional view and FIG. 2B is a top down view illustrating bottom spacer formation in a method of manufacturing a semiconductor device, according to an exemplary embodiment of the present invention. Referring to FIGS. 2A and 2B, a bottom spacer layer 130 is formed on the sacrificial layer 123, bottom source/drain regions 121 and 122 and the isolation region 115. The bottom spacer layer 130 includes, but is not necessarily limited to, silicon boron nitride (SiBN), siliconborocarbonitride (SiBCN), silicon oxycarbonitride (SiOCN), SiN or $SiO_x$. According to an embodiment of the present invention, the bottom spacer layer 130 is deposited using, for example, directional deposition techniques, including, but not necessarily limited to high density plasma (HDP) deposition and gas cluster ion beam (GCIB) deposition. The directional deposition deposits the spacer material preferably on the exposed horizontal surfaces, but not on lateral sidewalls. Alternatively, the spacer material can be deposited using, conformal deposition techniques, and removed from vertical surfaces using directional removal techniques, such as, for example, ME. Spacer material 130 formed on horizontal surfaces of the hardmasks 110 can be removed using a planarization process, such as, for example, CMP.

FIG. 3A is a cross-sectional view and FIG. 3B is a top down view illustrating gate structure and top spacer formation in a method of manufacturing a semiconductor device, according to an exemplary embodiment of the present invention. Referring to FIGS. 3A and 3B, gate metal layers 147 and 149 are deposited on gate dielectric layers 143. The gate dielectric layers 143 include, for example, a high-K material including but not necessarily limited to, $HfO_2$ (hafnium oxide), $ZrO_2$ (zirconium dioxide), hafnium zirconium oxide $Al_2O_3$ (aluminum oxide), and $Ta_2O_5$ (tantalum pentoxide).

The gate metal layers 147 and 149 include n-type gate metal layers 147, for example, n-type work function metal layers, and p-type gate metal layers 149, for example, p-type work function metal layers. The n-type and p-type gate metal layers are respectively deposited in the NFET and PFET regions. The n-type gate metal layers 147 include, but are not necessarily limited to, TiN, titanium aluminum nitride (TiAlN), titanium aluminum carbon nitride (TiAlCN), titanium carbide (TiC), titanium aluminum carbide (TiAlC), tantalum aluminum carbide (TaAlC), tantalum aluminum carbon nitride (TaAlCN) or lanthanum (La) doped TiN, TaN. The p-type gate metal layers 149 include, but are not necessarily limited to, titanium nitride (TiN), tantalum nitride (TaN) or ruthenium (Ru). The gate metal layers 147 and 149 are deposited using, for example, deposition techniques including, but not limited to, CVD, PECVD, RFCVD, PVD, ALD, MLD, MBD, PLD, LSMCD, sputtering, and/or plating The gate metal and gate dielectric layers 147, 149 and 143 are conformally deposited on the bottom spacer layer 130 and on and around the fins 105 including the hardmasks 110 thereon. A top spacer layer 135 is formed on the gate metal layers 147 and 149, and on an around the fins 105 including the hardmasks 110 thereon. The top spacer layer 135 includes, but is not necessarily limited to, silicon nitride (SiN), silicon boron nitride (SiBN), siliconborocarbonitride (SiBCN), or silicon oxycarbonitride (SiOCN). According to an embodiment of the present invention, the top spacer layer 135 is conformally deposited using, for example, deposition techniques including, but not limited to, CVD, PECVD, RFCVD, PVD, ALD, MLD, MBD, PLD, LSMCD, sputtering, and/or plating.

Figures 4A, 4B:
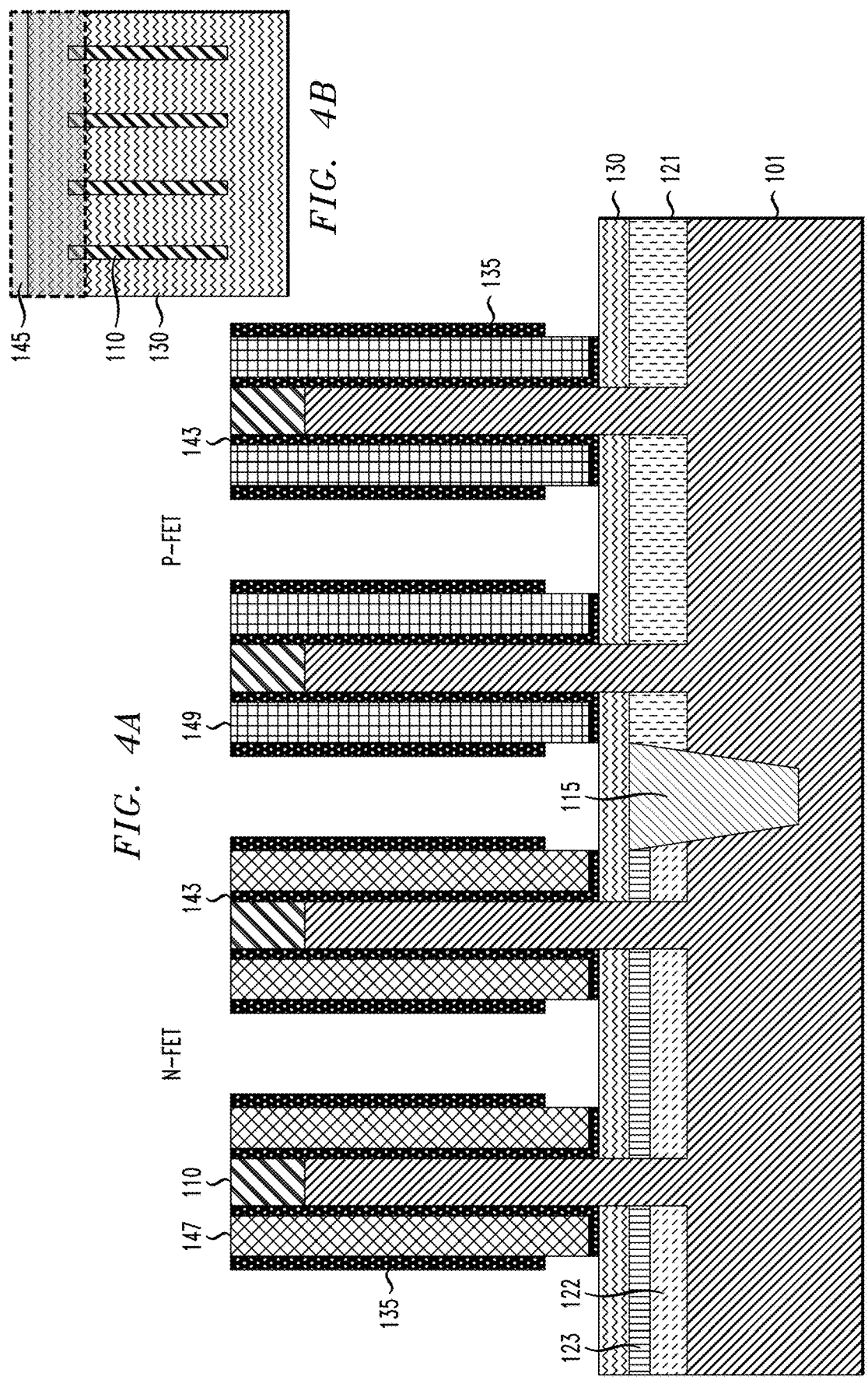
FIG. 4A is a cross-sectional view illustrating removal of bottom portions of gate structures in a method of manufacturing a semiconductor device, according to an exemplary embodiment of the present invention.
FIG. 4B is a top down view illustrating removal of bottom portions of gate structures in a method of manufacturing a semiconductor device, according to an exemplary embodiment of the present invention.

FIG. 4A is a cross-sectional view and FIG. 4B is a top view illustrating removal of bottom portions of gate structures in a method of manufacturing a semiconductor device, according to an exemplary embodiment of the present invention. Referring to FIGS. 4A and 4B, a directional etching process, such as, for example, RIE is performed to remove portions of the top spacer layer 135 and the gate structure including the gate dielectric and gate metal layers 143, 147 and 149 from the upper surfaces of the fins 105 including the hardmasks 110 thereon, and from portions of upper surface of the bottom spacer layer 130 adjacent the fins 105. The RIE process is performed using, for example, chlorine-based gases (e.g., various mixtures of $Cl_2$ gas with oxygen, nitrogen, helium and/or argon) and fluorine-based gases (e.g., $SF_6$, $CF_4$, $CHF_3$ or $C_4F_8$).

As can be seen in FIG. 4A, the ME process results in portions of the bottom spacer layer 130 being exposed. Referring to FIG. 4B, a gate contact (CB) region is covered by block mask 145 during the directional etching process. Portions of the gate structures under the block mask 145 are preserved during the directional etching process. The block mask 145 is formed of, for example, an organic planarization layer (OPL) or any other materials which would effectively block etching of underlying layers during RIE processing. Example OPL materials are described herein below.

FIG. 5A is a cross-sectional view and FIG. 5B is a top down view illustrating removal of exposed portions of a bottom spacer in a method of manufacturing a semiconductor device, according to an exemplary embodiment of the present invention. Referring to FIGS. 5A and 5B, exposed portions of a bottom spacer layer 130 are removed using, for example, a RIE process with a fluorine-based mixture of gases (e.g., $SF_6$, $CF_4$, $CHF_3$ or $C_4F_8$ combined with $O_2$, $N_2$, Ar, and/or He). As can be seen, the removal of the exposed portions of the bottom spacer layer 130 leaves exposed underlying portions of the sacrificial layer 123, the bottom source/drain region 121 and the isolation region 115.

Figure 6:
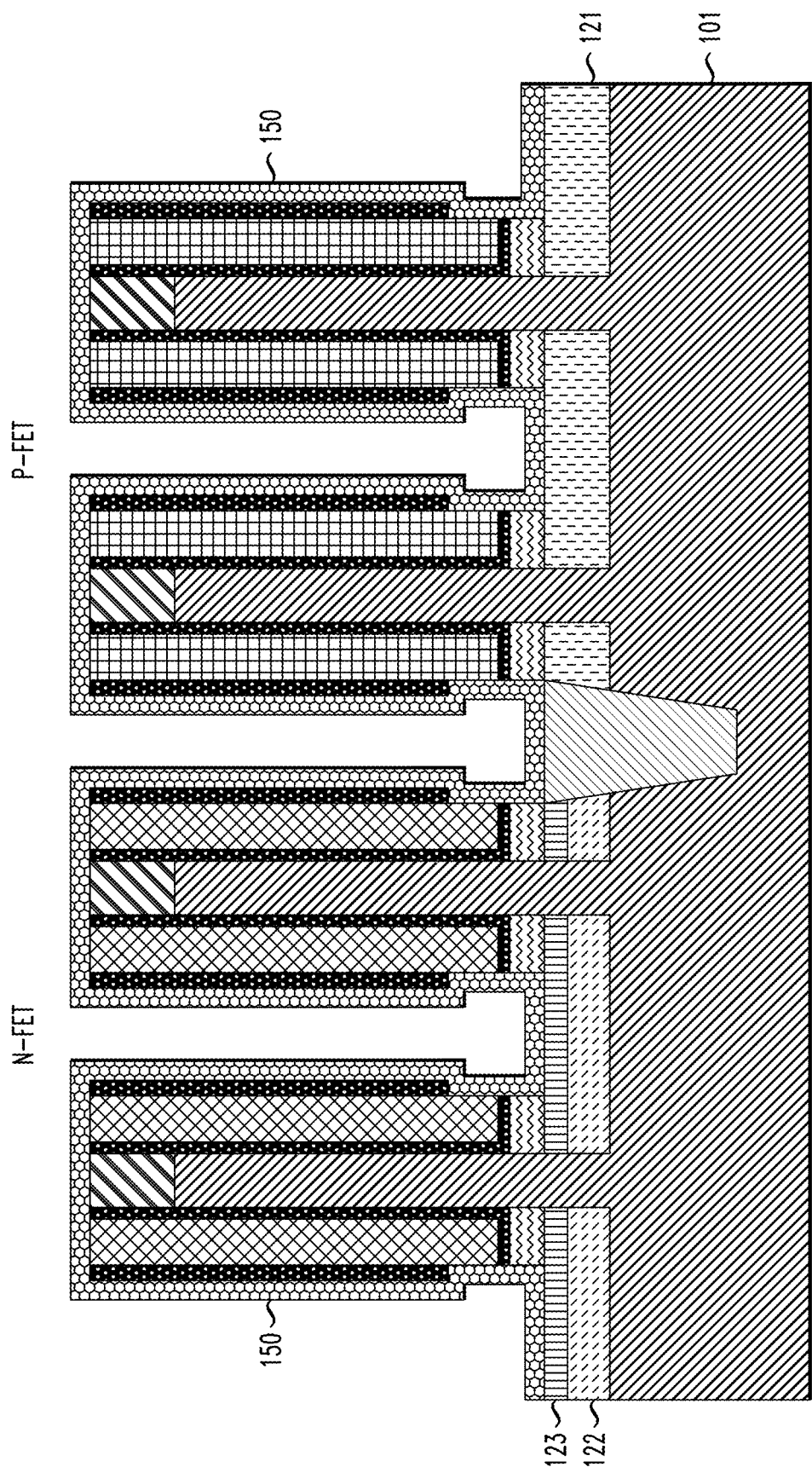
FIG. 6 is a cross-sectional view illustrating metal doped germanium oxide deposition in a method of manufacturing a semiconductor device, according to an exemplary embodiment of the present invention.

FIG. 6 is a cross-sectional view illustrating metal doped germanium oxide deposition in a method of manufacturing a semiconductor device, according to an exemplary embodiment of the present invention. Referring to FIG. 6, a metal-doped germanium oxide ($GeO_x$) layer 150 (where x is, for example, in the range of 1 to 2) is deposited using, for example, atomic layer deposition (ALD) or other conformal deposition process, on the structure from FIGS. 6A and 6B including on and around the fins 105 having the gate dielectric, gate metal layers and hardmask layers 143, 147, 149 and 110 thereon, on remaining portions of the top spacer layer 135 and the bottom spacer layer 130 and on the exposed portions of the sacrificial layer 123, the bottom source/drain region 121 and the isolation region 115. In a non-limiting embodiment, a thickness of the metal-doped $GeO_x$ layer 150 can be in the range of about 2 nm-about 6 nm. The $GeO_x$ layer 150 can be doped with, for example, yttrium (Y), lanthanum (La), scandium (Sc), hafnium (Hf), aluminum (Al), or titanium (Ti) at concentrations in the range of about 10% to about 30%.

Figure 7:
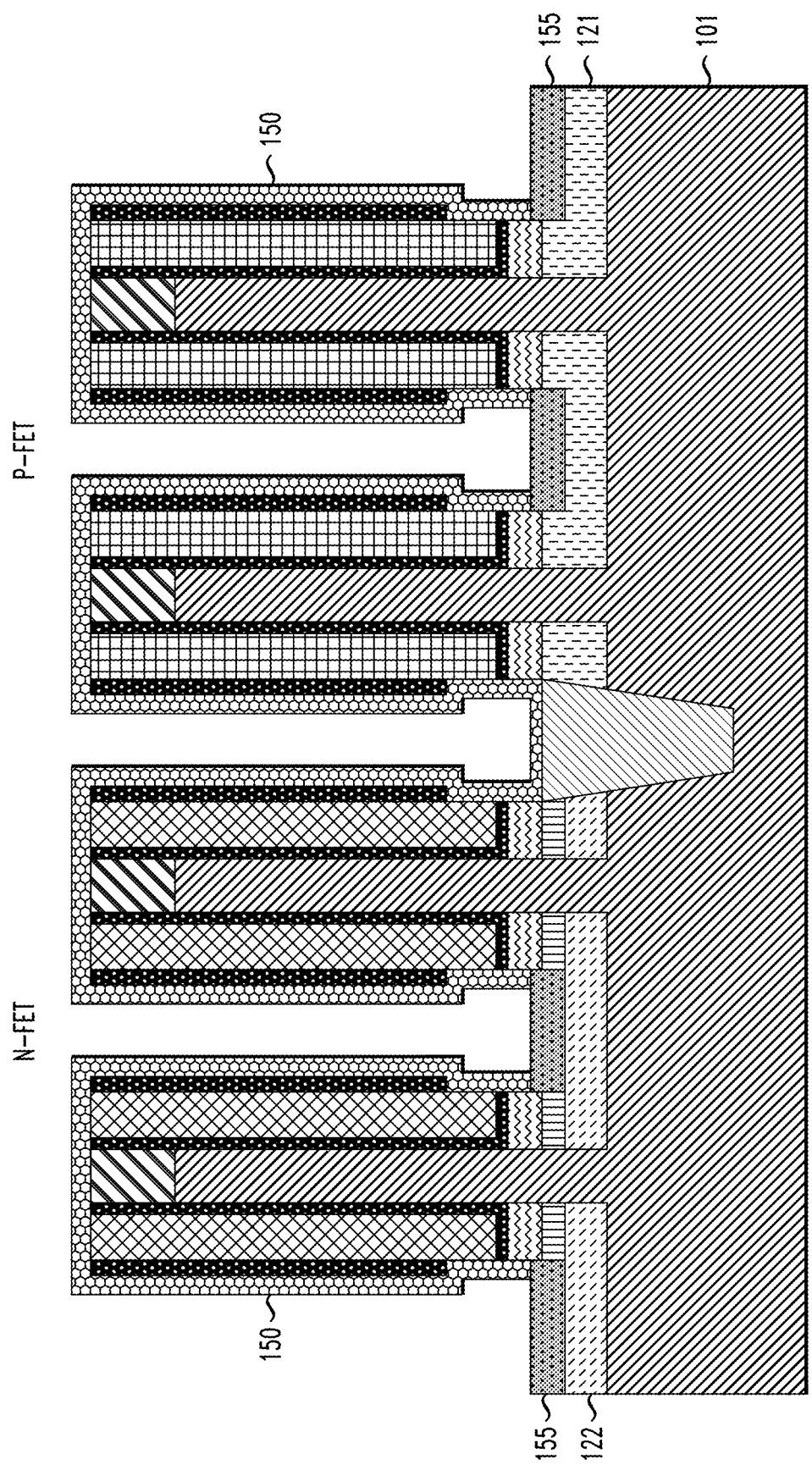
FIG. 7 is a cross-sectional view illustrating conversion of portions of the metal doped germanium oxide into silicide and/or germanide in a method of manufacturing a semiconductor device, according to an exemplary embodiment of the present invention.

FIG. 7 is a cross-sectional view illustrating conversion of portions of the metal doped germanium oxide into silicide and/or germanide in a method of manufacturing a semiconductor device, according to an exemplary embodiment of the present invention. Referring to FIG. 7, after deposition of the metal-doped $GeO_x$ layer 150, a thermal annealing process is performed in, for example, nitrogen ($N_2$), argon (Ar), helium (He), xenon (Xe), and/or hydrogen ($H_2$). The thermal annealing process converts the portions of the metal-doped $GeO_x$ layer 150 on the SiGe sacrificial layer 123 and on the SiGe bottom source/drain region 121 to silicide and/or germanide ("silicide/germanide") layers 155. The thermal annealing process causes desorption of $GeO_x$ from the metal-doped $GeO_x$ layer 150, SiGe:P sacrificial layer 123 and SiGe:B bottom source/drain region 121, resulting in metallic bonding to occur between the metal in the metal-doped $GeO_x$ layer 150 and the silicon and/or germanium in the underlying SiGe sacrificial layer 123 and SiGe bottom source/drain region 121. As a result, the portions of the metal-doped $GeO_x$ layer 150 on the sacrificial layer 123 and bottom source/drain region 121, as well as part or all of the sacrificial layer 123 and part bottom source/drain region 121 are converted to the silicide/germanide layers 155.

In more detail, in accordance with an embodiment of the present invention, if a SiGe:P sacrificial layer 123 has a low Ge concentration (<20%), germanium may be exhausted from the sacrificial layer 123 because the volatile species are coming from both metal-doped $GeO_x$ 150 and the sacrificial layer 123. In this case, silicide (not germanide) layers are formed in the N-FET region. If a SiGe:P sacrificial layer 123 has a Ge concentration which is higher than, for example, 20%, there may be remaining Ge in the sacrificial layer 123, resulting in layers 155 having a mixture of silicide and germanide. The germanium percentage, however, is not greater than that of silicon, so silicide is the primary component of the layers 155.

In the P-FET region, in accordance with an embodiment of the present invention, the SiGe:B bottom source/drain region 121 has an atomic Ge concentration higher than 50%. Thus, even though some Ge atoms desorb as a by-product of $GeO_x$, there remains a large number of Ge atoms in the bottom source/drain region 121. In this case, germanide is the primary component of the layers 155.

The silicide/germanide layers 155 are limited to formation in the epitaxially grown crystalline materials, and as shown in FIG. 7, are not formed on the other surfaces on which the metal-doped $GeO_x$ layer 150 was formed. The temperature at which the thermal annealing process is performed ranges from about 500° C. to about 700° C.

Figure 8:
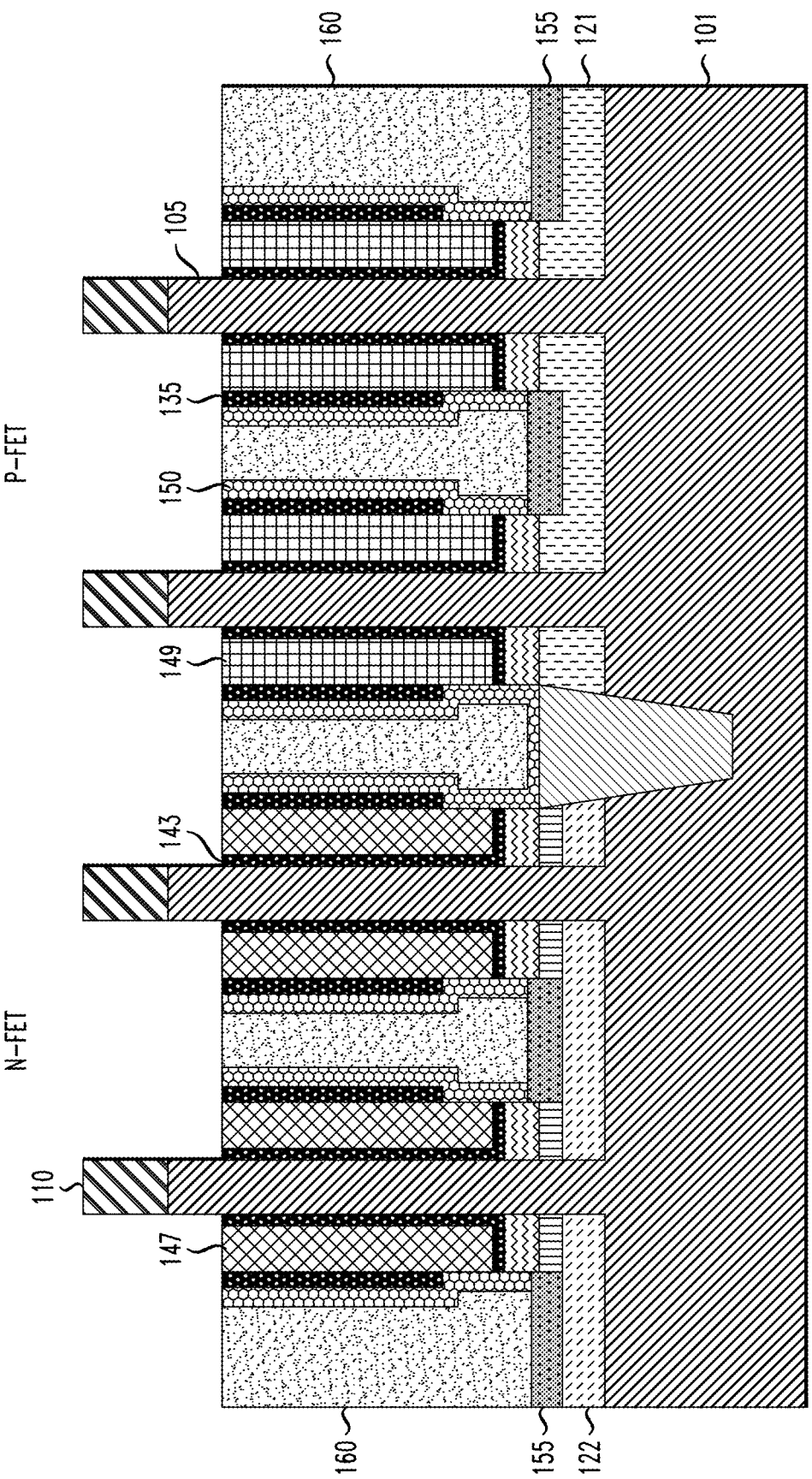
FIG. 8 is a cross-sectional view illustrating gate structure recessing in a method of manufacturing a semiconductor device, according to an exemplary embodiment of the present invention.

FIG. 8 is a cross-sectional view illustrating gate structure recessing in a method of manufacturing a semiconductor device, according to an exemplary embodiment of the present invention. Referring to FIG. 8, an OPL 160 is deposited on the structure from FIG. 7. The OPL comprises, but is not necessarily limited to, an organic polymer including C, H, and N. In an embodiment, the OPL material can be free of silicon (Si). According to an embodiment, the OPL material can be free of Si and fluorine (F). As defined herein, a material is free of an atomic element when the level of the atomic element in the material is at or below a trace level detectable with analytic methods available in the art. Non-limiting examples of the OPL material include JSR HM8006, JSR HM8014, AZ UM10M2, Shin Etsu ODL 102, or other similar commercially available materials from such vendors as JSR, TOK, Sumitomo, Rohm & Haas, etc. The OPL 160 can be deposited, for example, by spin coating, followed by a planarization process, such as, for example, CMP. The OPL 160 is then recessed using, for example, oxygen plasma, nitrogen plasma, hydrogen plasma or other carbon strip or ashing process, which causes minimal or no damage to the remaining layers. Following recessing of the OPL layer 160, an isotropic etch is performed to recess the gate structure, including the gate metal and gate dielectric layers 149, 147 and 143, and to recess the layers encapsulating the gate structures, including the top spacer layer 135, and the metal-doped $GeO_x$ layer 150. The recessing is selectively performed with respect to the fins and hardmasks 105, 110, and uses, for example $N_2/H_2$ or $N_2/O_2$ RIE.

Figure 9:
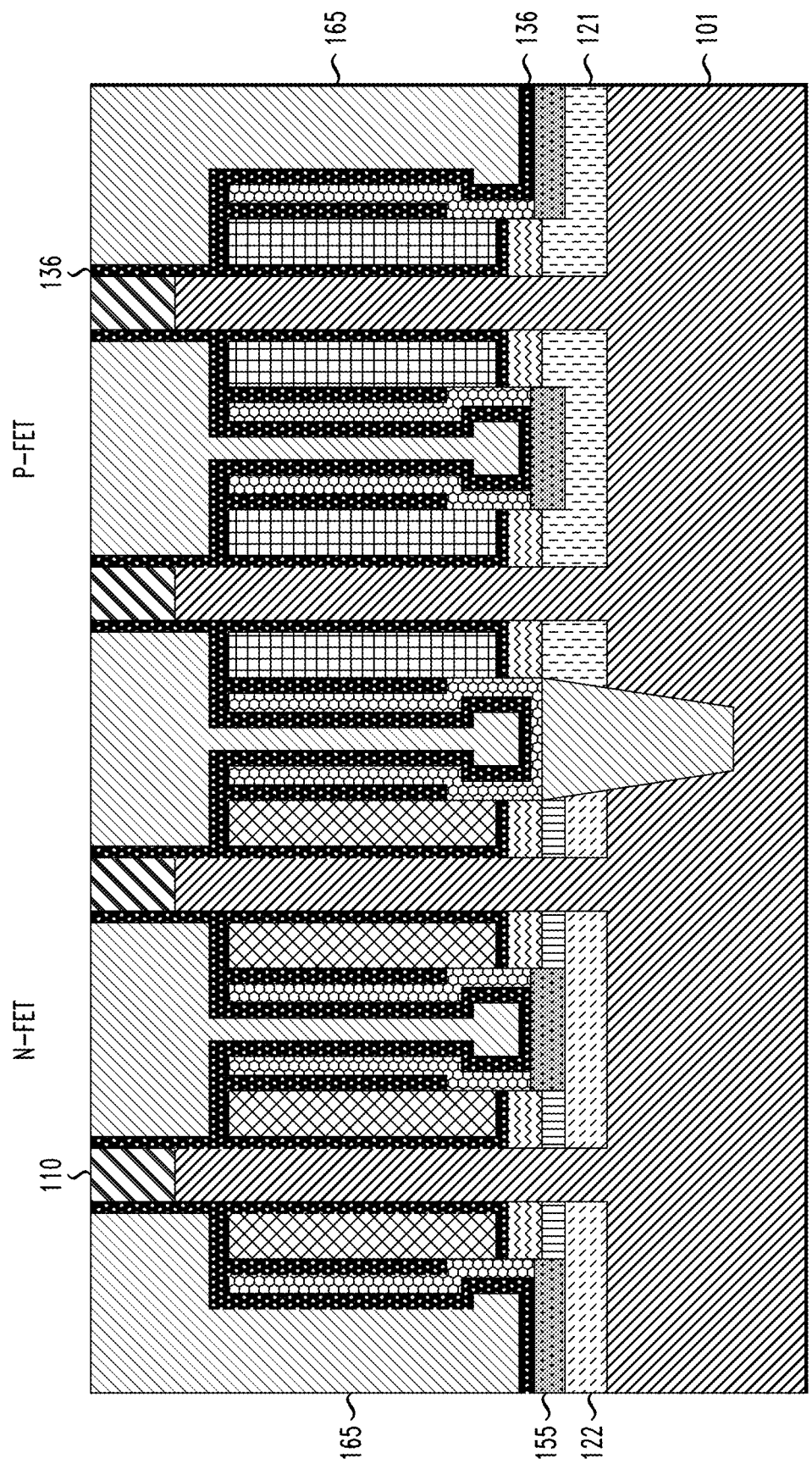
FIG. 9 is a cross-sectional view illustrating liner and dielectric fill layer deposition in a method of manufacturing a semiconductor device, according to an exemplary embodiment of the present invention.

FIG. 9 is a cross-sectional view illustrating liner and dielectric fill layer deposition in a method of manufacturing a semiconductor device, according to an exemplary embodiment of the present invention. Referring to FIG. 9, after the recessing discussed in connection with FIG. 8, the OPL layer 160 is removed using for example, oxygen plasma, nitrogen plasma, hydrogen plasma or other carbon strip or ashing process, which causes minimal or no damage to the remaining layers. A liner layer 136 is then conformally formed on the exposed portions of the fins and hardmasks 105 and 110, the gate structures including the gate dielectric and gate metal layers 143, 147 and 149, on the top spacer and metal-doped $GeO_x$ layers 135 and 150, and on the silicide/germanide layers 155. The liner layer 136 includes, but is not necessarily limited to, silicon nitride (SiN), silicon boron nitride (SiBN), siliconborocarbonitride (SiBCN), or silicon oxycarbonitride (SiOCN). According to an embodiment of the present invention, the liner layer 136 is conformally deposited using, for example, deposition techniques including, but not limited to, CVD, PECVD, RFCVD, PVD, ALD, MLD, MBD, PLD, LSMCD, sputtering, and/or plating.

Following deposition of the liner layer 136, a dielectric fill layer 165 is formed on the liner layer 136 to fill in gaps between and/or adjacent the fins 105, the gate structure layers 143, 147 and 149 and the layers 135, 150, and 136 encapsulating the gate structure layers. The dielectric fill layer 165 includes, but is not necessarily limited to, silicon oxide, SICO or other low-k dielectric materials. According to an embodiment of the present invention, the dielectric fill layer 165 is deposited using, for example, deposition techniques including, but not limited to, CVD, PECVD, RFCVD, PVD, ALD, MLD, MBD, PLD, LSMCD, sputtering, and/or plating, followed by a planarization process down to the hardmasks 110, such as, for example, CMP.

Figure 10:
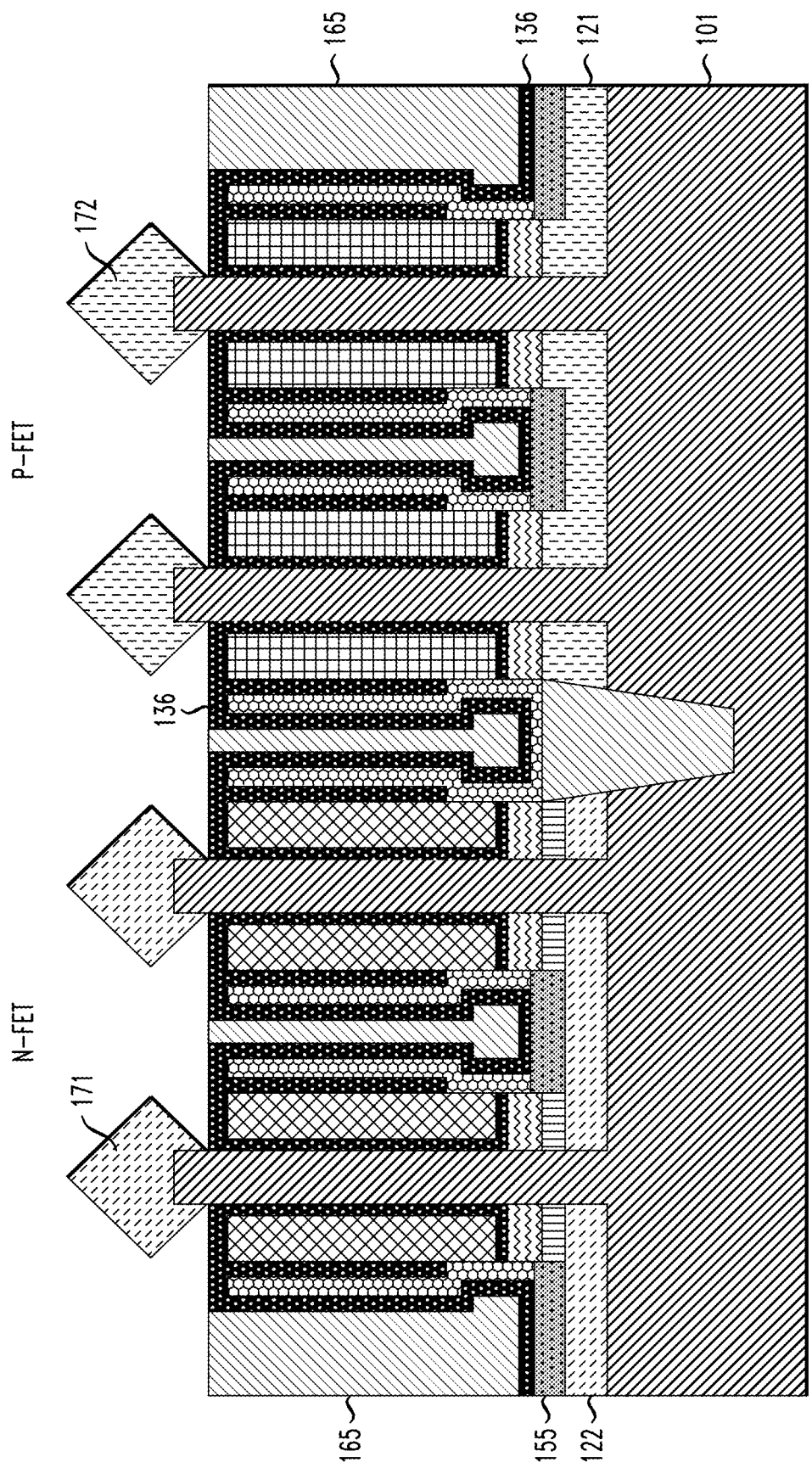
FIG. 10 is a cross-sectional view illustrating top source/drain formation in a method of manufacturing a semiconductor device, according to an exemplary embodiment of the present invention.

FIG. 10 is a cross-sectional view illustrating top source/drain formation in a method of manufacturing a semiconductor device, according to an exemplary embodiment of the present invention. Referring to FIG. 10, the hardmasks 110 are removed using a selective ME process. Then portions of the liner and dielectric fill layers 136 and 165 around upper portions of the fins 105 are removed to expose the upper portions of the fins 105. The removal of the portions of the liner and dielectric fill layers 136 and 165 is performed using, for example, a selective etch process, which is selective to the material of the fins 105. The selective etch process can include, for example, a fluorine-based mixture of gases (e.g., $SF_6$, $CF_4$, $CHF_3$ or $C_4F_8$ combined with $O_2$, $N_2$, Ar, and/or He).

Following the removal of the hardmasks 110 and the removal of the upper portions of the liner and dielectric fill layers 136 and 165 to expose the upper portions of the fins 105, the top source/drain regions 171 and 172 in the N-FET and P-FET regions, respectively, are epitaxially grown in epitaxial growth processes from the upper portions of the fins 105. The epitaxially grown top source/drain regions 171 and 172 can be formed in different epitaxial growth processes from each other where one region is masked while epitaxial growth is performed in the unmasked region. The epitaxially grown top source/drain regions 171 and 172 can be in-situ doped. Other alternative doping techniques can be used, including but not limited to, for example, ion implantation, gas phase doping, plasma doping, plasma immersion ion implantation, cluster doping, infusion doping, liquid phase doping, solid phase doping, etc., and dopants may include, for example, an n-type dopant selected from a group of phosphorus (P), arsenic (As) and antimony (Sb), and a p-type dopant selected from a group of boron (B), gallium (Ga), indium (In), and thallium (Tl) at various concentrations. For example, in a non-limiting example, a dopant concentration range may be $1\times1018/cm3$ to $1\times1021/cm3$. According to an embodiment, the top source/drain region 172 includes boron doped SiGe, and the top source/drain region 171 includes phosphorous doped silicon.

Figure 11:
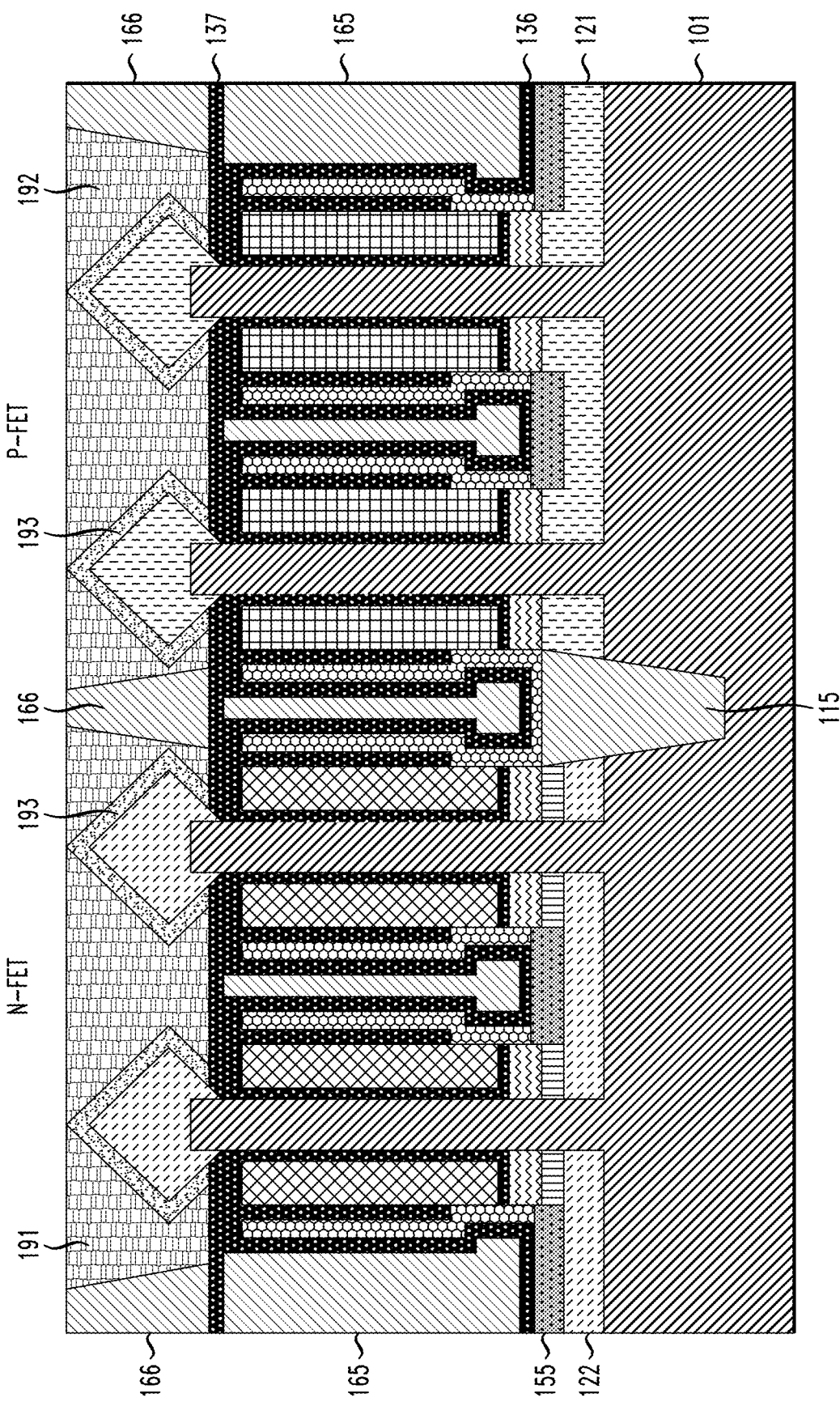
FIG. 11 is a cross-sectional view illustrating formation of top source/drain contacts in a method of manufacturing a semiconductor device, according to an exemplary embodiment of the present invention.

FIG. 11 is a cross-sectional view illustrating formation of top source/drain contacts in a method of manufacturing a semiconductor device, according to an exemplary embodiment of the present invention. Referring to FIG. 11, an additional liner layer 137 is deposited on exposed upper surfaces of the dielectric fill and liner layers 165 and 136, and on the top source/drain regions 171 and 172. The additional liner layer 137 includes the same or similar material as the liner layer 136 and the top spacer layer 135, and is conformally deposited using, for example, deposition techniques including, but not limited to, CVD, PECVD, RFCVD, PVD, ALD, MLD, MBD, PLD, LSMCD, sputtering, and/or plating. Prior to formation of the top contact layer 191, the additional liner layer 137 is removed from around the top source/drain regions 171 and 172 by, for example, an etch process, such as RIE.

Following deposition of the additional liner layer 137, another dielectric fill layer 166 is formed on the liner layer 137 to fill in gaps between the top source/drain regions 171 and 172. The dielectric fill layer 166 includes the same or similar materials as the dielectric fill layer 165, and is deposited using, for example, deposition techniques including, but not limited to, CVD, PECVD, RFCVD, PVD, ALD, MLD, MBD, PLD, LSMCD, sputtering, and/or plating, followed by a planarization process, such as, for example, CMP.

Trenches are respectively opened in the dielectric fill layer 166 over the top source/drain regions 171 and 172 using, for example, lithography followed by ME. The liner layer 137 on the top source/drain regions 171 and 172 is removed to expose the top source/drain regions 171 and 172. Contacts to top source/drain regions 171 and 172 are formed in the trenches by filling the trenches with contact material layers 191 and 192, such as, for example, electrically conductive material including, but not necessarily limited to, tungsten, cobalt, zirconium, tantalum, titanium, aluminum, ruthenium, and/or copper. A liner layer 193 including, for example, titanium and/or titanium nitride, may be formed on the top source/drain regions 171 and 172 before filling the trenches with the contact material layers 191 and 192. Although not shown, the liner layer can also be formed on side and bottom surfaces of the trenches before filling the trenches with the contact material layers 191 and 192.

Deposition of the contact material layers 191 and 192 can be performed using one or more deposition techniques, including, but not necessarily limited to, CVD, PECVD, PVD, ALD, MBD, PLD, LSMCD, and/or spin-on coating, followed by planarization using a planarization process, such as, for example, CMP.

Figure 12:
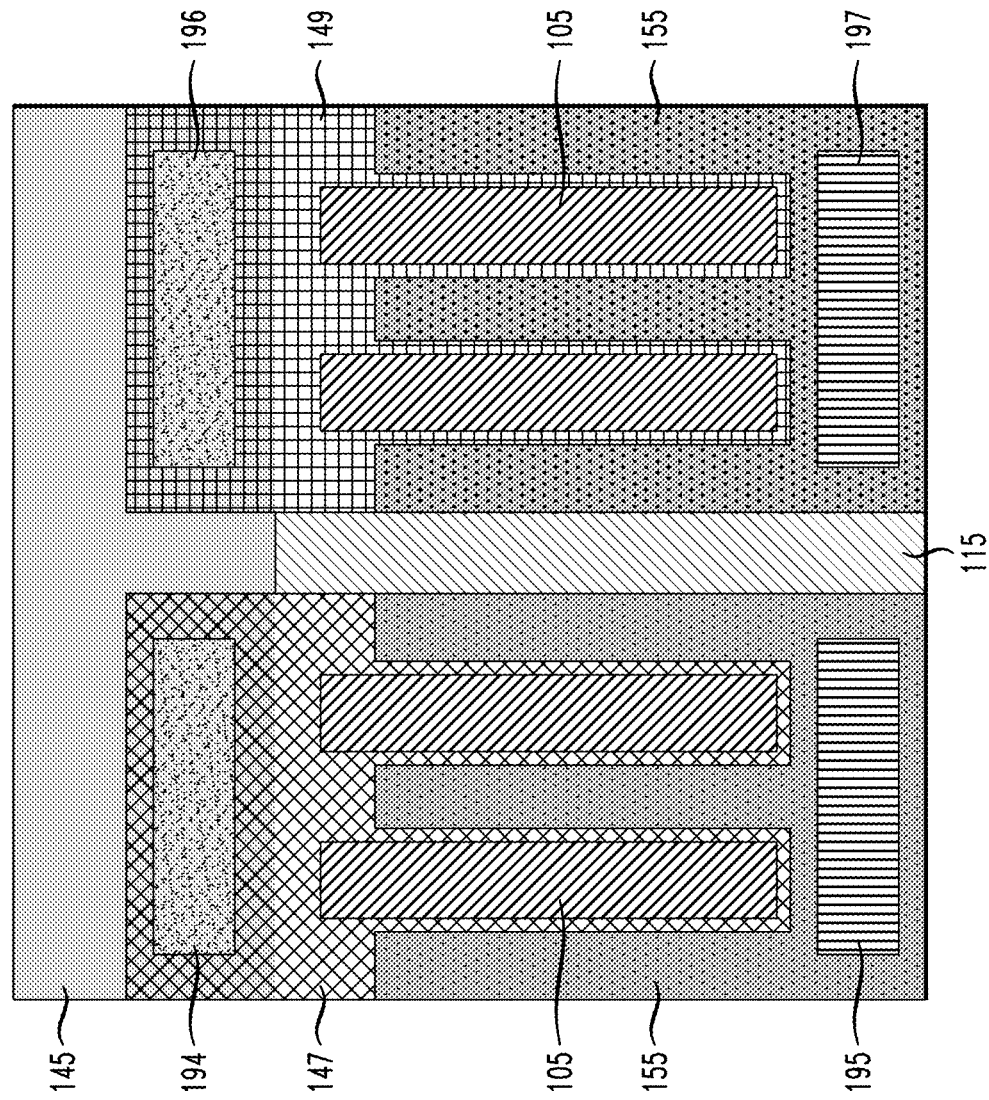
FIG. 12 is a top down view of the semiconductor device in FIG. 11, according to an exemplary embodiment of the present invention.

FIG. 12 is a top down view of the semiconductor device in FIG. 11, according to an exemplary embodiment of the present invention. As can be seen in FIG. 12, due to the presence of the block mask 145, silicide/germanide layers 155 are not formed around gate contacts (CB) 194 and 196 in N-FET and P-FET regions. As can be seen in FIG. 12, the silicide/germanide layers 155 cover a majority of a footprint of the fins 105, and are formed around the bottom source/drain contacts (trench silicide (TS)) 195 and 197 instead of just lining the bottom source contacts 195 and 197. The silicide/germanide layers 155 are formed around the fins 105 on multiple sides of each of the fins 105. For example, the silicide/germanide layers 155 are formed around at least three sides of the fins 105 and correspond to most of the fin footprints. The silicide/germanide layers 155 also surround all sides of the bottom source/drain contacts (trench silicide (TS)) 195 and 197. Due to this structure of silicide/germanide layers 155, external resistance at bottom source/drain regions 121 and 122 is reduced relative to conventional designs. For simplicity, only the gate metal layers 147 and 149 are shown around the fins 105 in FIG. 12, although it is to be understood that other layers are present around the fins, including, for example, the gate dielectric and top spacer layers 143 and 135. The gate contacts 194 and 196 and bottom source/drain contacts 195 and 197 can have the same or similar materials as the top source/drain contact layers 191 and 192.

FIG. 13 is a cross-sectional view of the semiconductor device in FIG. 11 taken parallel to a length of the fins along the substrate, according to an exemplary embodiment of the present invention. Some elements may be omitted from FIG. 13 for simplicity. Referring to FIG. 13, a bottom source/drain contact 195 is formed through the dielectric fill layers 166 and 165 and the bottom spacer 130 and contacts a silicide/germanide layer 155 formed on a bottom source/drain region 122. FIG. 13 further illustrates a gate contact 194 formed through the dielectric fill layers 166 and 165 to contact a work function metal layer 147 of a gate structure, and a top source/drain contact 191 formed through the dielectric fill layer 166 to contact the top source/drain region 171. A top spacer layer 136 is positioned between a gate metal layer 147 (e.g., work function metal layer) and the top source/drain region 171, and isolation regions 115 are formed in trenches in the substrate 101.

FIGS. 14-20 illustrate steps a method of manufacturing a semiconductor device, according to another exemplary embodiment of the present invention. Some of the processes described in connection with FIGS. 14-20 are the same or substantially the same as the processes described in connection with FIGS. 1A-11 and detailed explanation of these same or similar processes may be omitted. As noted herein above, the same or similar reference numbers used throughout the drawings are used to denote the same or similar features, elements, or structures, and thus, a detailed explanation of the same or similar features, elements, or structures will not necessarily be repeated for each of the drawings. For example, the embodiment described in connection with FIGS. 14-20 has reference numerals in the 200s, which are the same or similar to the reference numerals in the 100s in FIGS. 1A-13.

Figure 14:
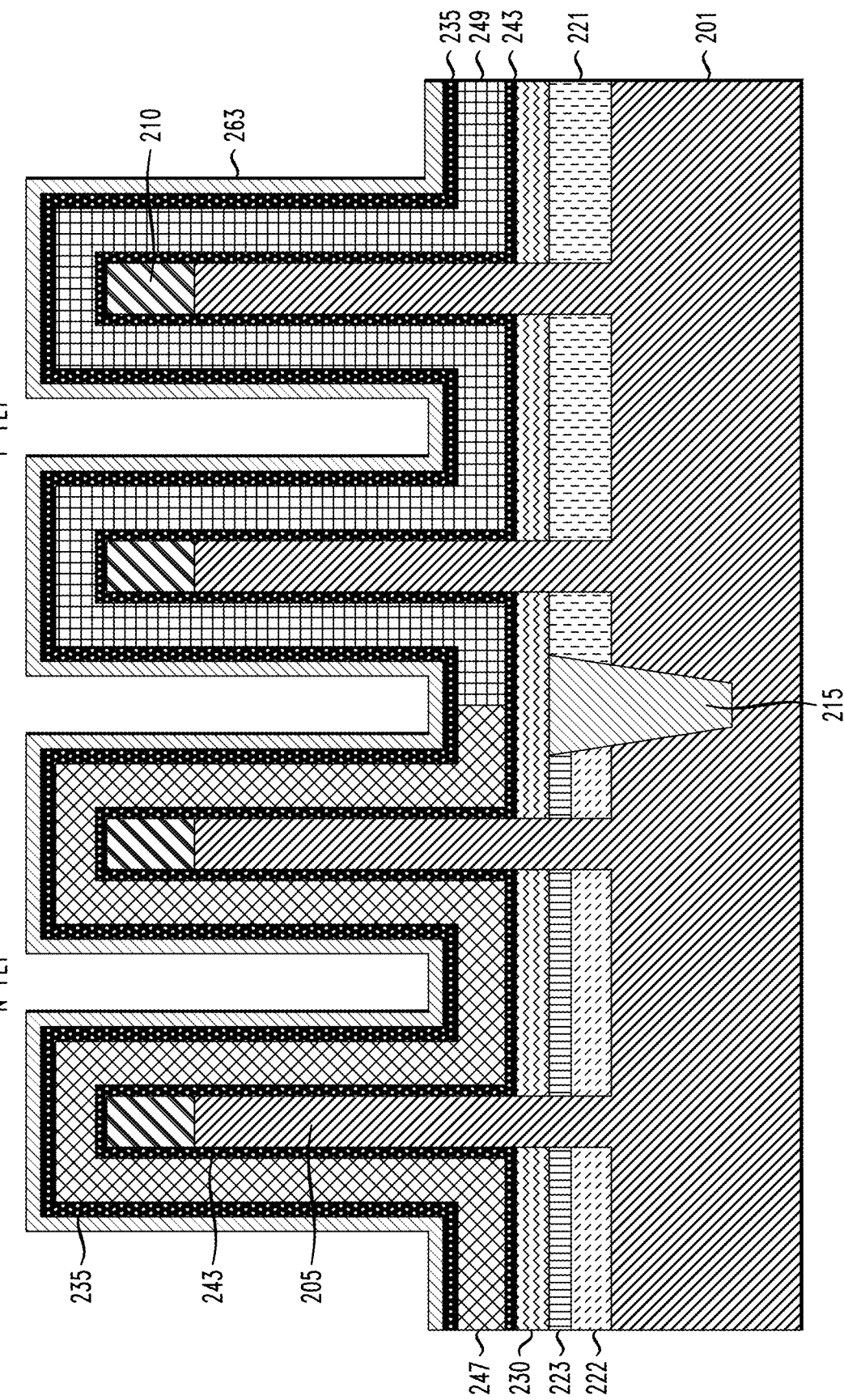
FIG. 14 is a cross-sectional view illustrating gate structure, top spacer and dielectric layer deposition in a method of manufacturing a semiconductor device, according to an exemplary embodiment of the present invention.

Following the processing described in FIGS. 1A-2B, similar to what is described in FIGS. 3A and 3B, FIG. 14 is a cross-sectional view illustrating gate structure and top spacer deposition in a method of manufacturing a semiconductor device, according to an exemplary embodiment of the present invention. Referring to FIG. 14, gate metal layers 247 and 249, like gate metal layers 147 and 149 are deposited on gate dielectric layers 243 (like gate dielectric layers 143). The gate dielectric layers 243 and gate metal layers 247 and 249 include the same or similar materials and are deposited using the same or similar techniques as the gate dielectric layers 243 and gate metal layers 247 and 249.

The gate metal and gate dielectric layers 247, 249 and 243 are conformally deposited on the bottom spacer layer 230 and on and around the fins 205 including the hardmasks 210 thereon. A top spacer layer 235 is formed on the gate metal layers 247 and 249, and on an around the fins 105 including the hardmasks 210 thereon. The bottom spacer and top spacer layers 230 and 235, as well as the substrate 201, fins 205, hardmasks 210, isolation region 215, bottom source/drain regions 221 and 222 and sacrificial layer 223 are the same or similar to the corresponding elements described in connection with FIGS. 1A-13.

Unlike FIGS. 3A and 3B, FIG. 14 includes the addition of a dielectric layer 263 conformally deposited on the top spacer layer 235 using, for example, deposition techniques including, but not limited to, CVD, PECVD, RFCVD, PVD, ALD, MLD, MBD, PLD, LSMCD, sputtering, and/or plating. The dielectric layer 263 includes, for example, $SiO_x$ and has a thickness which is the same or similar to that of the top spacer layer 235.

Figure 15:
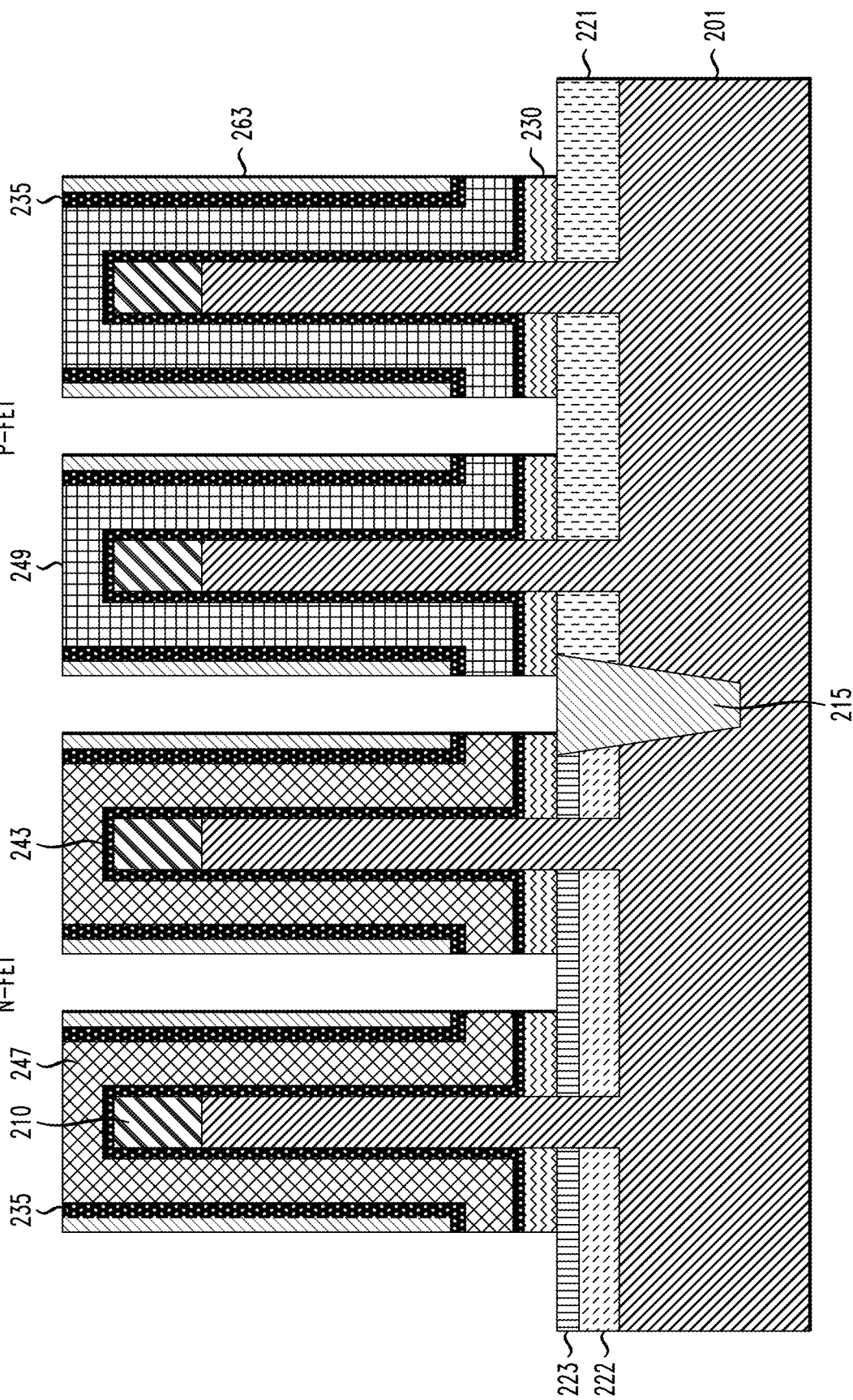
FIG. 15 is a cross-sectional view illustrating removal of portions of the top spacer and dielectric layer, and removal of subsequently exposed portions of gate structures and underlying portions of a bottom spacer layer in a method of manufacturing a semiconductor device, according to an exemplary embodiment of the present invention.

FIG. 15 is a cross-sectional view illustrating removal of portions of the top spacer and dielectric layer, and removal of subsequently exposed portions of gate structures and underlying portions of a bottom spacer layer. Referring to FIG. 15, portions of the top spacer and dielectric layers 235 and 263 are removed from on top of parts of the gate metal layers 247 and 249. The removal results in an L-shaped top spacer layer 235 on the gate metal layers 247 and 249. The removal exposes the underlying portions of the gate metal layers 247 and 249, and is performed using a directional etching process, such as, for example, a directional RIE with a fluorine-based mixture of gases (e.g., $SF_6$, $CF_4$, $CHF_3$ or $C_4F_8$ combined with $O_2$, $N_2$, Ar, and/or He).

Similar to what is described in connection with FIGS. 4A-5B, a directional etching process, such as, for example, ME is performed to remove portions of the gate structure including the gate dielectric and gate metal layers 243, 247 and 249 from portions of upper surface of the bottom spacer layer 230 between and/or to the side of the fins 205. The ME process results in portions of the bottom spacer layer 230 being exposed. A gate contact (CB) region is covered by block mask (not shown) during the directional etching process. Portions of the gate structures under the block mask are preserved during the directional etching process.

Portions of a bottom spacer layer 230 are also removed using, for example, a RIE process the same or similar to that described in connection with FIGS. 5A and 5B. The removal of the portions of the bottom spacer layer 230 leaves exposed underlying portions of the sacrificial layer 223, the bottom source/drain region 221 and the isolation region 215.

Figure 16:
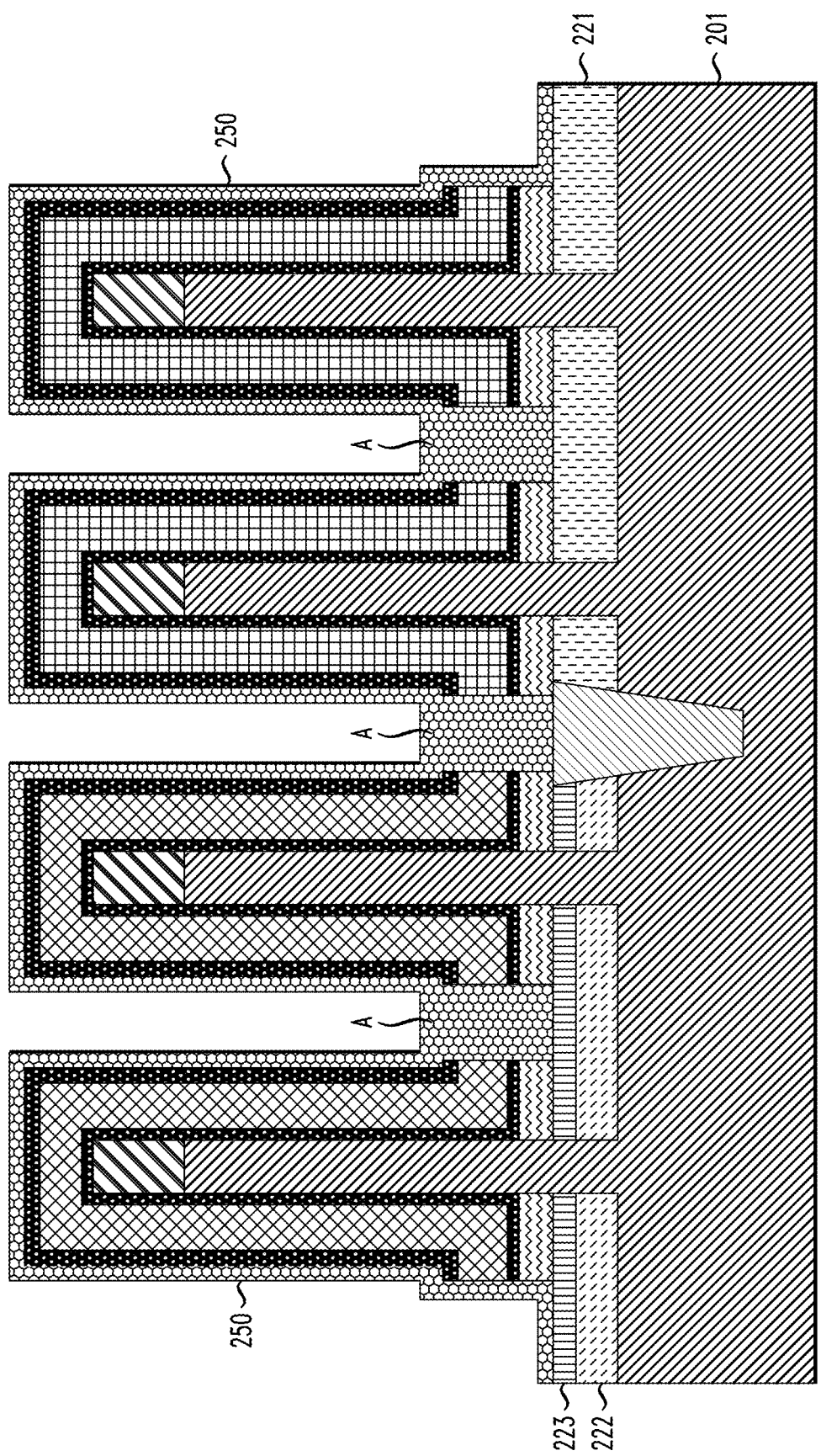
FIG. 16 is a cross-sectional view illustrating metal doped germanium oxide deposition in a method of manufacturing a semiconductor device, according to an exemplary embodiment of the present invention.

FIG. 16 is a cross-sectional view illustrating metal doped germanium oxide deposition in a method of manufacturing a semiconductor device, according to an exemplary embodiment of the present invention. Similar to what is described in connection with FIG. 6, a metal-doped $GeO_x$ layer 250 is deposited using a conformal deposition process, on the structure from FIG. 15 including on and around the fins 205 having the gate dielectric, gate metal layers and hardmask layers 243, 247, 249 and 210 thereon, on remaining portions of the top spacer layer 235 and the bottom spacer layer 230 and on the exposed portions of the sacrificial layer 223, the bottom source/drain region 221 and the isolation region 215. Prior to deposition of the metal-doped $GeO_x$ layer 250, which is the same or similar to metal-doped $GeO_x$ layer 150, the dielectric layer 263 is removed. Unlike what is shown in FIG. 6, due to openings between the fins 205 having a smaller width than the openings in FIG. 6, the conformal deposition of the metal-doped $GeO_x$ layer 250 on vertical and horizontal surfaces in the openings causes pinching-off of the metal-doped $GeO_x$ layer 250, resulting in the metal-doped $GeO_x$ layer 250 filling in the openings as shown by references A in FIG. 16.

Figure 17:
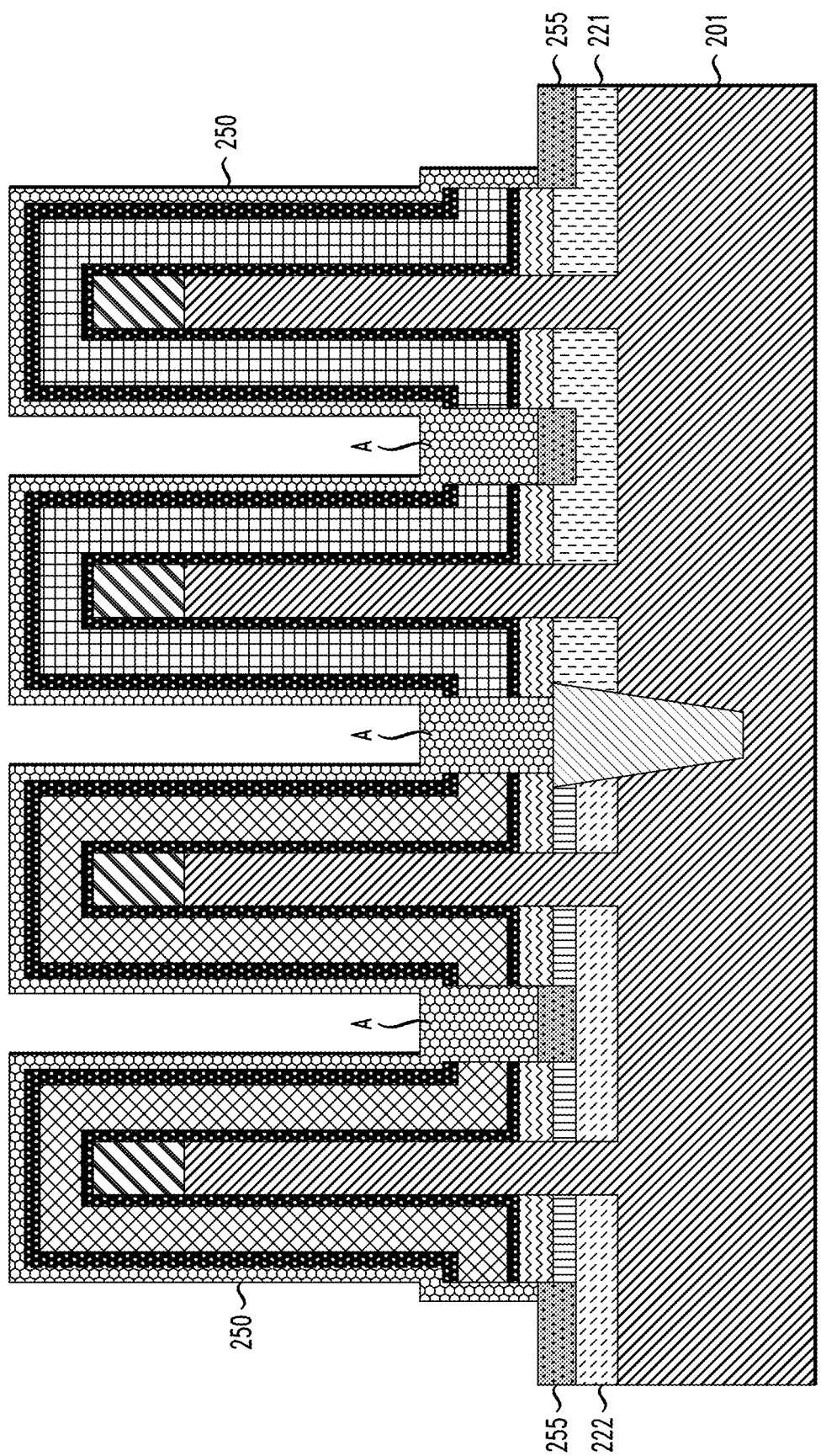
FIG. 17 is a cross-sectional view illustrating conversion of portions of the metal doped germanium oxide into silicide and/or germanide in a method of manufacturing a semiconductor device, according to an exemplary embodiment of the present invention.

FIG. 17 is a cross-sectional view illustrating conversion of portions of the metal doped germanium oxide into silicide and/or germanide in a method of manufacturing a semiconductor device, according to an exemplary embodiment of the present invention. Referring to FIG. 17, similar to the processing described in connection with FIG. 7, after deposition of the metal-doped $GeO_x$ layer 250, a thermal annealing process is performed to convert the portions of the metal-doped $GeO_x$ layer 250 on the SiGe sacrificial layer 223 and on the SiGe bottom source/drain region 221, as well as part or all of the underlying sacrificial layer 223 and part of the underlying bottom source/drain region 221 to silicide/germanide layers 255.

Figure 18:
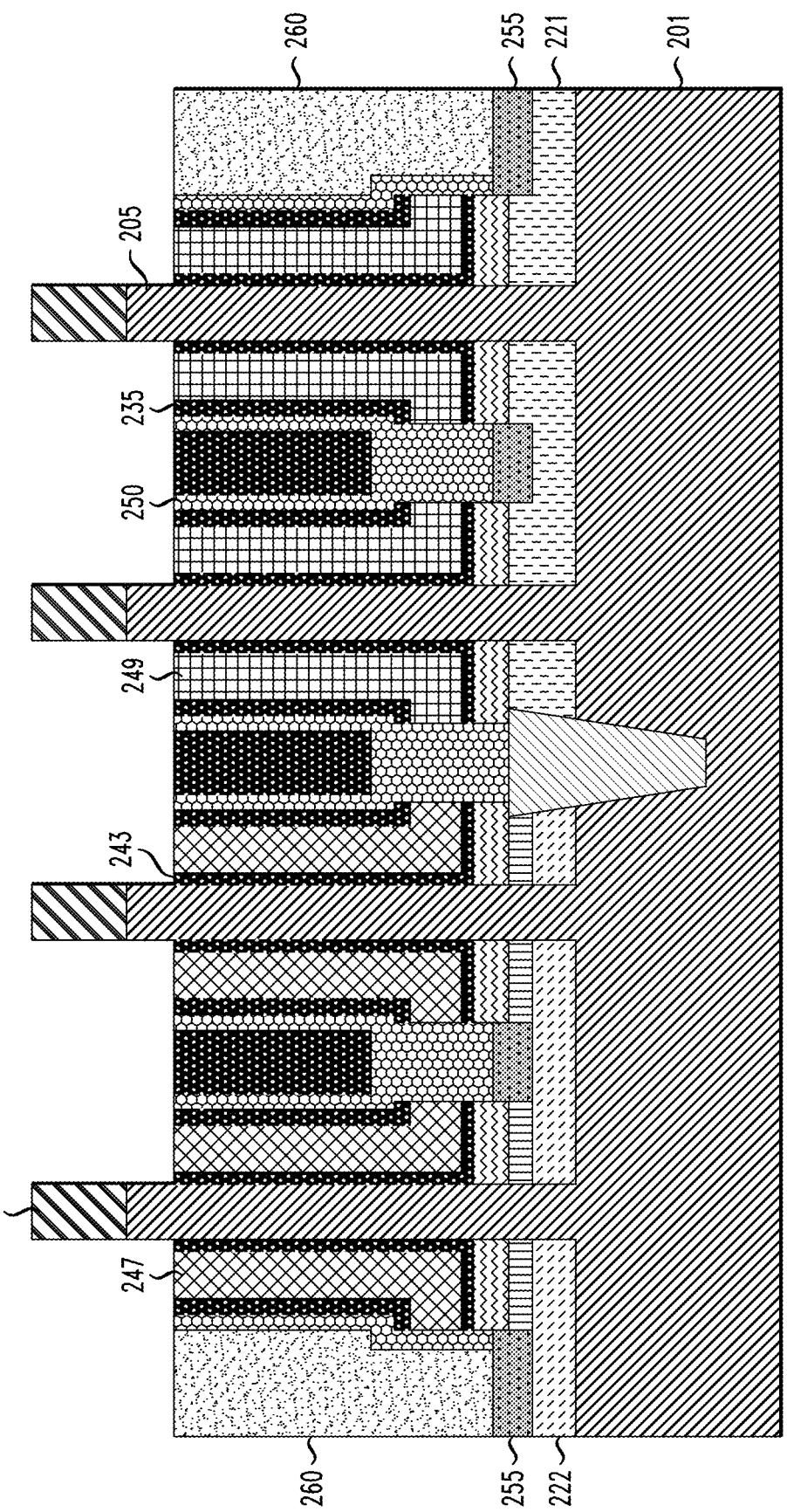
FIG. 18 is a cross-sectional view illustrating gate structure recessing in a method of manufacturing a semiconductor device, according to an exemplary embodiment of the present invention.

FIG. 18 is a cross-sectional view illustrating gate structure recessing in a method of manufacturing a semiconductor device, according to an exemplary embodiment of the present invention. Referring to FIG. 18, similar to the processing described in connection with FIG. 8, an OPL 260 is deposited on the structure from FIG. 18 by, for example, spin coating, followed by a planarization process, such as, for example, CMP. The OPL 260 is then recessed, and following recessing of the OPL layer 260, an isotropic etch is performed to recess the gate structure, including the gate metal and gate dielectric layers 249, 247 and 243, and to recess the layers encapsulating the gate structures, including the top spacer layer 235, and the metal-doped $GeO_x$ layer 250.

Figure 19:
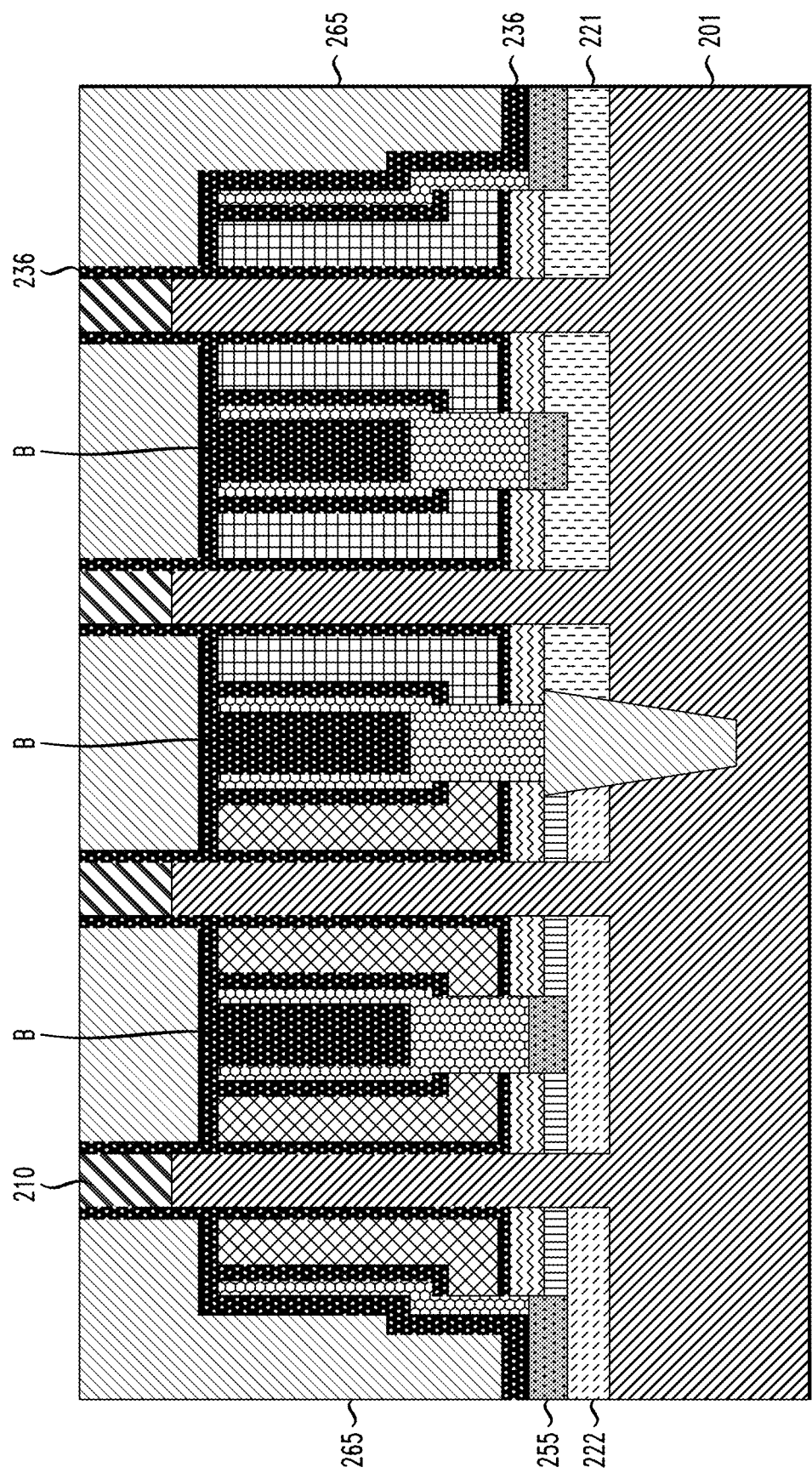
FIG. 19 is a cross-sectional view illustrating liner and dielectric fill layer deposition in a method of manufacturing a semiconductor device, according to an exemplary embodiment of the present invention.

FIG. 19 is a cross-sectional view illustrating liner and dielectric fill layer deposition in a method of manufacturing a semiconductor device, according to an exemplary embodiment of the present invention. Referring to FIG. 19, similar to processing discussed in connection with FIG. 9, after the recessing discussed in connection with FIG. 18, the OPL layer 260 is removed using for example, oxygen plasma, nitrogen plasma, hydrogen plasma or other carbon strip or ashing process, which causes minimal or no damage to the remaining layers. A liner layer 236 is then conformally formed on the exposed portions of the fins and hardmasks 205 and 210, the gate structures including the gate dielectric and gate metal layers 243, 247 and 249, on the top spacer and metal-doped $GeO_x$ layers 235 and 250, and on the silicide/germanide layers 255. Similar to the pinching-off described in connection with FIG. 18, due to openings between the fins 205 left by the removal of the OPL 260 having a smaller width than the openings in FIG. 9, the conformal deposition of the liner layer 236 on vertical and horizontal surfaces in the openings causes pinching-off of the liner layer 236, resulting in liner layer 236 filling in the openings as shown by references B in FIG. 19. The areas B are over areas A where the pinching-off occurred with the metal-doped $GeO_x$ layer 250. The liner layer 236 includes the same or similar materials and is deposited using the same or similar deposition techniques as the liner layer 136.

Following deposition of the liner layer 236, a dielectric fill layer 265 similar to the dielectric fill layer 165 is formed on the liner layer 236 to fill in gaps between and/or adjacent the fins 205 and further encapsulating the gate structure layers 243, 247 and 249. The dielectric fill layer 265 includes the same or similar materials and is deposited using the same or similar deposition techniques as the dielectric fill layer 165.

Figure 20:
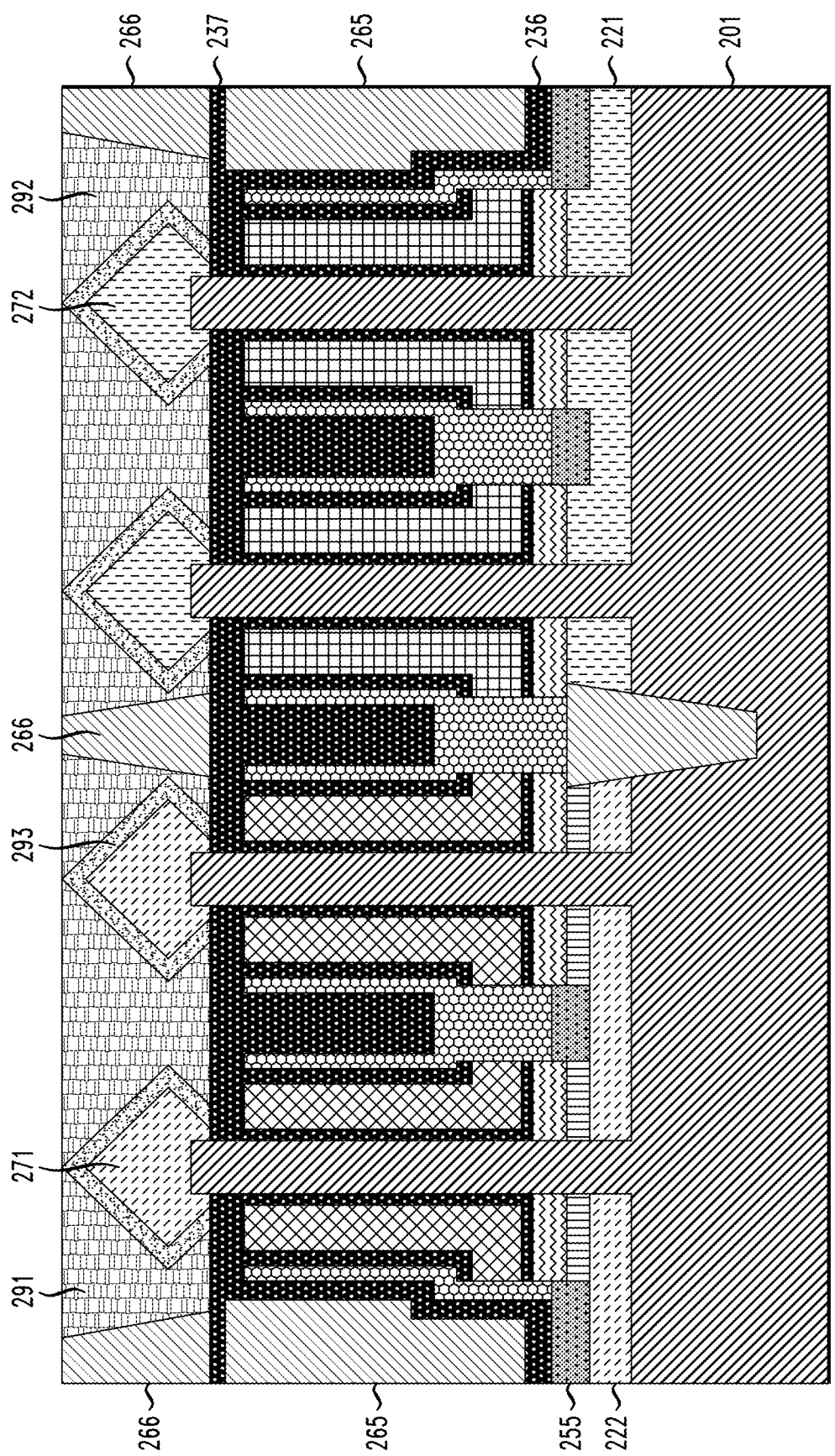
FIG. 20 is a cross-sectional view illustrating top source/drain formation and formation of top source/drain contacts in a method of manufacturing a semiconductor device, according to an exemplary embodiment of the present invention.

FIG. 20 is a cross-sectional view illustrating top source/drain formation and formation of top source/drain contacts in a method of manufacturing a semiconductor device, according to an exemplary embodiment of the present invention. Similar to the processing described in connection with FIG. 10, the hardmasks 210 are removed, and then portions of the liner and dielectric fill layers 236 and 265 around upper portions of the fins 205 are removed to expose the upper portions of the fins 205.

Following the removal of the hardmasks 210 and the removal of the upper portions of the liner and dielectric fill layers 236 and 265 to expose the upper portions of the fins 205, the top source/drain regions 271 and 272 in the N-FET and P-FET regions, respectively, are epitaxially grown in epitaxial growth processes from the upper portions of the fins 205. Like the top source/drain regions 171 and 172, the epitaxially grown top source/drain regions 271 and 272 can be formed in different epitaxial growth processes from each other, and can be in-situ doped with n-type and p-type dopants, respectively. According to an embodiment, the top source/drain region 272 includes boron doped SiGe, and the top source/drain region 271 includes phosphorous doped silicon.

Similar to the processing described in connection with FIG. 11, referring to FIG. 20, an additional liner layer 237, like the additional liner layer 137, is deposited on exposed upper surfaces of the dielectric fill and liner layers 265 and 236, and on the top source/drain regions 271 and 272.

Following deposition of the additional liner layer 237, another dielectric fill layer 266 is formed on the liner layer 237 to fill in gaps between the top source/drain regions 271 and 272. The dielectric fill layer 266 includes the same or similar materials and is deposited using the same or similar techniques as the dielectric fill layer 166.

Trenches are respectively opened in the dielectric fill layer 266 over the top source/drain regions 271 and 272, and the liner layer 237 on the top source/drain regions 271 and 272 is removed to expose the top source/drain regions 271 and 272. Contacts to top source/drain regions 271 and 272 are formed in the trenches by filling the trenches with contact material layers 291 and 292 the same or similar to the contact material 191 and 192. A liner layer 293 including, for example, titanium and/or titanium nitride, may be formed on the top source/drain regions 271 and 272 before filling the trenches with the contact material layers 291 and 292. Although not shown, the liner layer can also be formed on side and bottom surfaces of the trenches before filling the trenches with the contact material layers 291 and 292.

Deposition of the contact material layers 291 and 292 can be performed using one or more deposition techniques, including, but not necessarily limited to, CVD, PECVD, PVD, ALD, MBD, PLD, LSMCD, and/or spin-on coating, followed by planarization using a planarization process, such as, for example, CMP.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A vertical transistor device, comprising:
   a first plurality of fins in a first device region on a substrate;
   a second plurality of fins in a second device region on the substrate;
   a plurality of bottom source/drain regions on the substrate adjacent lower portions of each of the first and second plurality of fins in the first and second device regions;
   a plurality of gate structures on the plurality of bottom source/drain regions;
   at least one of a plurality of silicide layers and a plurality of germanide layers on the plurality of bottom source/drain regions adjacent the plurality of gate structures; and
   a plurality of germanium oxide layers disposed on at least part of the at least one of the plurality of silicide layers and the plurality of germanide layers.

2. The vertical transistor device according to claim 1, wherein a plurality of semiconductor layers are positioned on lateral sides each of the at least one of the plurality of silicide layers and the plurality of germanide layers in the first device region.

3. The vertical transistor device according to claim 2, wherein the plurality of semiconductor layers comprise silicon germanium.

4. The vertical transistor device according to claim 3, wherein the plurality of semiconductor layers are formed in the first device region under the plurality of gate structures and on a first bottom source/drain region of the plurality of bottom source/drain regions.

5. The vertical transistor device according to claim 1, wherein the at least one of the plurality of silicide layers and the plurality of germanide layers are formed around the first and second plurality of fins on multiple sides of each of the first and second plurality of fins.

6. The vertical transistor device according to claim 1, wherein the plurality of germanium oxide layers are metal-doped germanium oxide layers.

7. The vertical transistor device according to claim 1, wherein the plurality of germanium oxide layers are further disposed on sides of the plurality of gate structures.

8. The vertical transistor device according to claim 7, further comprising a plurality of spacer layers disposed on the sides of the plurality of gate structures between the plurality of gate structures and portions of the plurality of germanium oxide layers.

9. The vertical transistor device according to claim 1, further comprising a plurality of liner layers disposed on the plurality of germanium oxide layers.

10. The vertical transistor device according to claim 1, further comprising a plurality of contacts to the plurality of bottom source/drain regions, wherein the at least one of the plurality of silicide layers and the plurality of germanide layers are formed around a plurality of sides of the plurality of contacts.

11. The vertical transistor device according to claim 10, wherein the at least one of the plurality of silicide layers and the plurality of germanide layers are formed around all sides of the plurality of contacts.

12. The vertical transistor device according to claim 1, wherein the first and second device regions respectively comprise n-type and p-type transistor regions.

13. A vertical transistor device, comprising:
   a first fin in a first device region on a substrate;
   a second fin in a second device region on the substrate;
   a first bottom source/drain region on the substrate adjacent a lower portion of the first fin in the first device region;
   a second bottom source/drain region on the substrate adjacent a lower portion of the second fin in the second device region;
   at least one of a first silicide layer and a first germanide layer on the first bottom source/drain region;

at least one of a second silicide layer and a second germanide layer on the second bottom source/drain region; and a semiconductor layer on a lateral side of the at least one of the first silicide layer and the first germanide layer and on the first bottom source/drain region in the first device region.

14. The vertical transistor device according to claim 13, wherein the first bottom source/drain region comprises silicon and the semiconductor layer comprises silicon germanium.

15. The vertical transistor device according to claim 13, further comprising:

a first germanium oxide layer disposed on at least part of the at least one of the first silicide layer and the first germanide layer; and a second germanium oxide layer disposed on at least part of the at least one of the second silicide layer and the second germanide layer.

16. The vertical transistor device according to claim 15, wherein the first and second germanium oxide layers are metal-doped germanium oxide layers.

17. The vertical transistor device according to claim 15, further comprising:

a first gate structure adjacent the first fin on the first bottom source/drain region; and a second gate structure adjacent the second fin on the second bottom source/drain region;

wherein the first and second germanium oxide layers are disposed on sides of the first and second gate structures, respectively.

18. The vertical transistor device according to claim 17, further comprising:

a first spacer layer and a second spacer layer respectively disposed on the sides of the first and second gate structures between the first and second gate structures and portions of the first and second germanium oxide layers.

19. The vertical transistor device according to claim 13, further comprising:

a first contact to the first bottom source/drain region; and a second contact to the second bottom source/drain region;

wherein the at least one of the first silicide layer and the first germanide layer is formed around a plurality of sides of the first contact; and wherein the at least one of the second silicide layer and the second germanide layer is formed around a plurality of sides of the second contact.

* * * * *